(12) United States Patent
Son et al.

(10) Patent No.: US 12,713,778 B2
(45) Date of Patent: Aug. 18, 2026

(54) DISPLAY APPARATUS AND METHOD OF MANUFACTURING THE SAME

(71) Applicant: Samsung Display Co., LTD., Yongin-si (KR)

(72) Inventors: Sewan Son, Yongin-si (KR); Sungho Kim, Yongin-si (KR); Minwoo Woo, Yongin-si (KR); Seunghyun Lee, Yongin-si (KR); Wangwoo Lee, Yongin-si (KR); Jiseon Lee, Yongin-si (KR); Kyeongwoo Jang, Yongin-si (KR); Sugwoo Jung, Yongin-si (KR); Hyeri Cho, Yongin-si (KR); Seunggyu Tae, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 368 days.

(21) Appl. No.: 18/387,136

(22) Filed: Nov. 6, 2023

(65) Prior Publication Data

US 2024/0196659 A1 Jun. 13, 2024

(30) Foreign Application Priority Data

Dec. 7, 2022 (KR) ........................ 10-2022-0170040

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC ............. H10K 59/122; H10K 59/1201; H10K 59/131; H10K 59/1213; H10K 59/123;
(Continued)

(56) References Cited

U.S. PATENT DOCUMENTS 8,378,352 B2 2/2013 Lee et al.
8,716,058 B2 5/2014 Choi et al.
(Continued)

FOREIGN PATENT DOCUMENTS

KR 101193196 B1 10/2012
KR 101372852 B1 3/2014
(Continued)

*Primary Examiner* — Anne M Hines
*Assistant Examiner* — Jose M Diaz
(74) *Attorney, Agent, or Firm* — CANTOR COLBURN LLP

(57) ABSTRACT

A display apparatus includes a first sub-pixel electrode, a conductive bank layer which is disposed on the first sub-pixel electrode and in which a first opening overlapping the first sub-pixel electrode is defined. The conductive bank layer includes first and second conductive layers having different etch selectivities from each other, an insulating layer which is disposed between a peripheral portion of the first sub-pixel electrode and the conductive bank layer and in which an opening overlapping the first opening is defined, an insulating protective layer which is disposed between the insulating layer and the conductive bank layer and in which an opening overlapping the first opening is defined. The insulating protective layer includes an insulating material having an etch selectivity different from an etch selectivity of the insulating layer, a first intermediate layer overlapping the first sub-pixel electrode through the first opening of the conductive bank layer.

25 Claims, 20 Drawing Sheets

(58) Field of Classification Search
CPC ............. H10K 59/124; H10K 59/8051; H10K 59/8052; H10K 59/873; H10K 71/00; H10K 71/231; H10H 20/857; H10H 29/142
See application file for complete search history.

(56) References Cited

U.S. PATENT DOCUMENTS

| | | | |
|---|---|---|---|
| 8,975,811 | B2 | 3/2015 | Yoon |
| 10,910,590 | B2 | 2/2021 | Harikrishna Mohan et al. |
| 2022/0077252 | A1 | 3/2022 | Choung et al. |
| 2022/0392981 | A1* | 12/2022 | Nishimura ........... H10K 59/173 |

FOREIGN PATENT DOCUMENTS

| | | | |
|---|---|---|---|
| KR | 20140139864 | A | 12/2014 |
| KR | 1020150090635 | A | 8/2015 |

* cited by examiner

DISPLAY APPARATUS AND METHOD OF MANUFACTURING THE SAME

This application claims priority to Korean Patent Application No. 10-2022-0170040, filed on Dec. 7, 2022, and all the benefits accruing therefrom under 35 U.S.C. § 119, the content of which in its entirety is herein incorporated by reference.

BACKGROUND

1. Field

Embodiments relate to a display apparatus and a method of manufacturing the same.

2. Description of the Related Art

Display apparatuses visually display data. A display apparatus may provide an image by light-emitting diodes. Display apparatuses are being used for various purposes, and various designs are being attempted to improve the quality of display apparatuses.

SUMMARY

Embodiments provide a display apparatus and a method of manufacturing the same.

Additional features will be set forth in part in the description which follows and, in part, will be apparent from the description, or may be learned by practice of the presented embodiments.

In an embodiment of the disclosure, a display apparatus includes a first sub-pixel electrode, a conductive bank layer which is disposed on the first sub-pixel electrode and in which a first opening overlapping the first sub-pixel electrode is defined, the conductive bank layer including a first conductive layer and a second conductive layer having different etch selectivities from each other, an insulating layer which is disposed between a peripheral portion of the first sub-pixel electrode and the conductive bank layer and in which an opening overlapping the first opening is defined, an insulating protective layer which is disposed between the insulating layer and the conductive bank layer and in which an opening overlapping the first opening is defined, the insulating protective layer including an insulating material having an etch selectivity different from an etch selectivity of the insulating layer, a first intermediate layer overlapping the first sub-pixel electrode through the first opening of the conductive bank layer, a first counter electrode overlapping the first intermediate layer through the first opening of the conductive bank layer, and a first inorganic barrier layer on the first counter electrode.

In an embodiment, a width of the opening of the insulating protective layer may be greater than a width of the opening of the insulating layer.

In an embodiment, the first inorganic barrier layer may continuously extend to overlap a top surface and a side surface of the conductive bank layer and a top surface of the first counter electrode.

In an embodiment, the second conductive layer of the conductive bank layer may be disposed on a top surface of the first conductive layer. The second conductive layer includes a tip protruding toward the first opening from a point at which the top surface of the first conductive layer and a bottom surface of the second conductive layer meet each other.

In an embodiment, the first inorganic barrier layer may include a first portion overlapping the opening of the insulating layer, a second portion overlapping a top surface of the tip of the second conductive layer, a third portion overlapping a bottom surface of the tip of the second conductive layer, and a fourth portion between the second portion and the third portion. When projected in a direction perpendicular to a top surface of the first sub-pixel electrode, the first portion does not overlap the fourth portion.

In an embodiment, the fourth portion of the first inorganic barrier layer may include a round surface in a cross-sectional view.

In an embodiment, the first inorganic barrier layer may further include a fifth portion between the third portion and the first portion. The fourth portion overlaps the fifth portion and a part of the fourth portion directly contacts a part of the fifth portion.

In an embodiment, a cavity may be defined between the third portion and the fifth portion and disposed under the tip.

In an embodiment, the insulating protective layer and the insulating layer may include different inorganic insulating materials from each other.

In an embodiment, the display apparatus may further include an insulating material portion disposed on a side surface of the insulating layer in the opening of the insulating layer, the insulating material portion and the insulating protective layer including a same material.

In an embodiment, the display apparatus may further include a conductive protective layer which is disposed between the first sub-pixel electrode and the insulating layer and in which an opening overlapping the opening of the insulating layer is defined.

In an embodiment, the conductive protective layer may include at least one conductive oxide of indium tin oxide ("ITO"), indium zinc oxide ("IZO"), indium gallium zinc oxide ("IGZO"), indium tin zinc oxide ("ITZO"), zinc oxide (ZnO), aluminum-doped zinc oxide ("AZO"), gallium-doped zinc oxide ("GZO"), zinc tin oxide ("ZTO"), gallium tin oxide ("GTO"), and fluorine-doped tin oxide ("FTO"). The insulating protective layer includes an amorphous inorganic insulating material of at least one of silicon oxide and silicon nitride.

In an embodiment of the disclosure, a method of manufacturing a display apparatus includes forming a first sub-pixel electrode, forming an insulating layer in which an opening overlapping the first sub-pixel electrode is defined, forming an insulating protective layer disposed on the insulating layer and overlapping the first sub-pixel electrode through the opening of the insulating layer, forming a conductive bank layer which is disposed on the insulating protective layer and in which a first opening overlapping the first sub-pixel electrode is defined, and the conductive bank layer including a first conductive layer and a second conductive layer having different etch selectivities from each other, defining an opening of the insulating protective layer overlapping the first opening by etching a part of the insulating protective layer through the first opening of the conductive bank layer, forming a first intermediate layer overlapping the first sub-pixel electrode through the first opening of the conductive bank layer and the opening of the insulating protective layer, forming a first counter electrode overlapping the first intermediate layer, and forming a first inorganic barrier layer on the first counter electrode.

In an embodiment, a width of the opening of the insulating protective layer may be greater than a width of the opening of the insulating layer.

In an embodiment, the method may further include forming a conductive protective layer which is disposed between the first sub-pixel electrode and the insulating layer and in which an opening overlapping the opening of the insulating layer is defined.

In an embodiment, the forming the conductive protective layer may include defining the opening of the conductive protective layer by etching a part of the conductive protective layer. Here, an etching process for defining the opening of the conductive protective layer is different from an etching process for defining the opening of the insulating protective layer.

In an embodiment, the conductive protective layer may include at least one conductive oxide of ITO, IZO, IGZO, ITZO, zinc oxide (ZnO), AZO, GZO, ZTO, GTO, and FTO. Here, the insulating protective layer includes an amorphous inorganic insulating material of at least one of silicon oxide and silicon nitride.

In an embodiment, the first inorganic barrier layer may continuously extend to overlap a top surface and a side surface of the conductive bank layer and a top surface of the first counter electrode.

In an embodiment, the forming the conductive bank layer may include defining the first opening passing through the second conductive layer and the first conductive layer of the conductive bank layer. Here, the second conductive layer includes a tip protruding toward the first opening from a point at which a top surface of the first conductive layer and a bottom surface of the second conductive layer meet each other.

In an embodiment, the first inorganic barrier layer may include a first portion overlapping the opening of the insulating layer, a second portion overlapping a top surface of the tip of the second conductive layer, a third portion overlapping a bottom surface of the tip of the second conductive layer, and a fourth portion between the second portion and the third portion. Here, when projected in a direction perpendicular to a top surface of the first sub-pixel electrode, the first portion does not overlap the fourth portion.

In an embodiment, the fourth portion of the first inorganic barrier layer may include a round surface in a cross-sectional view.

In an embodiment, the first inorganic barrier layer may further include a fifth portion between the third portion and the first portion. The fourth portion overlaps the fifth portion and a part of the fourth portion directly contacts a part of the fifth portion.

In an embodiment, the method may further include defining a cavity between the third portion and the fifth portion and under the tip.

In an embodiment, the insulating protective layer and the insulating layer may include different inorganic insulating materials from each other.

In an embodiment, the method may further include forming an insulating material portion disposed on a side surface of the insulating layer in the opening of the insulating layer. The insulating material portion and the insulating protective layer include a same material.

BRIEF DESCRIPTION OF THE DRAWINGS

The above and other features and advantages of illustrative embodiments will be more apparent from the following description taken in conjunction with the accompanying drawings, in which.

DETAILED DESCRIPTION

Figure 1:
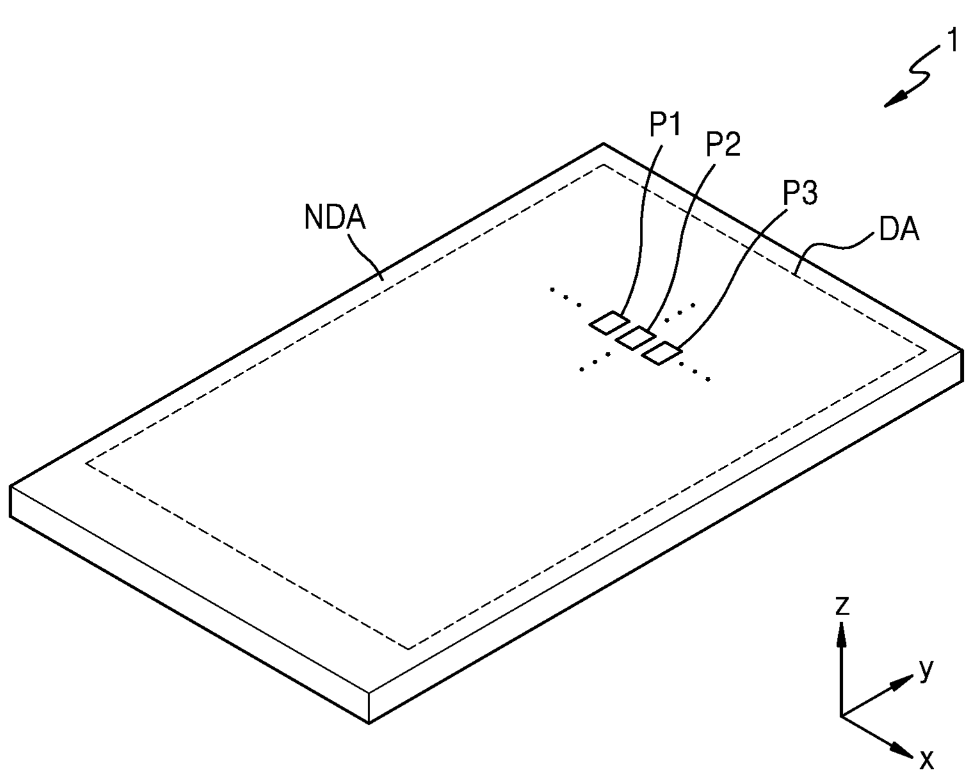
FIG. 1 is a perspective view schematically illustrating an embodiment of a display apparatus.

Reference will now be made in detail to embodiments, embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b and c" or "at least one selected from a, b and c" indicates only a, only b, only c, both a and b, both a and c, both b and c, all of a, b, and c, or variations thereof.

As the disclosure allows for various changes and numerous embodiments, illustrative embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, where the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," and "having," are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

When an illustrative embodiment may be implemented differently, a specific process order may be different from the described order. For example, two consecutively described processes may be performed substantially at the same time or may be performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating an embodiment of a display apparatus 1.

Referring to FIG. 1, the display apparatus 1 may include a display area DA, and a non-display area NDA disposed outside the display area DA. The display area DA may display an image through a first sub-pixel P1, a second sub-pixel P2, and a third sub-pixel P3 disposed in the display area DA. The non-display area NDA that is disposed outside the display area DA and does not display an image may surround an entirety of the display area DA. A driver or the like for applying an electrical signal or power to the display area DA may be disposed in the non-display area NDA. A pad to which an electronic element or a printed circuit board may be electrically connected may be disposed in the non-display area NDA.

Although the display area DA has a polygonal shape (e.g., a quadrangular shape) in which a length in an x direction is less than a length in a y direction in FIG. 1, in another embodiment, the display apparatus 1 may have a polygonal shape (e.g., a quadrangular shape) in which a length in the y direction is less than a length in the x direction. Although the display area DA has a substantially quadrangular shape in FIG. 1, the disclosure is not limited thereto. In another embodiment, the display area DA may have any of various shapes such as an N-gon shape (N is a natural number equal to or greater than 3), a circular shape, or an elliptical shape. Although the display area DA has a shape with corners where straight lines meet each other in FIG. 1, in another embodiment, the display area DA may have a polygonal shape with round corners.

The display apparatus 1 may be applied to any of various products such as a television, a laptop computer, a monitor, an advertisement board, or an Internet of things ("IoT") product as well as a portable electronic device such as a mobile phone, a smartphone, a tablet personal computer, a mobile communication terminal, an electronic organizer, an electronic book, a portable multimedia player ("PMP"), a navigation device, or an ultra-mobile personal computer ("UMPC"). Also, the display apparatus 1 in an embodiment may be used in a wearable device such as a smart watch, a watch phone, a glasses-type display, or a head-mounted display ("HMD"). Also, the display apparatus 1 in an embodiment may be applied to a center information display ("CID") disposed on an instrument panel, a center fascia, or a dashboard of a vehicle, a room mirror display replacing a side-view mirror of a vehicle, or a display screen disposed on the back of a front seat for entertainment for a passenger in a back seat of a vehicle.

Figure 2:
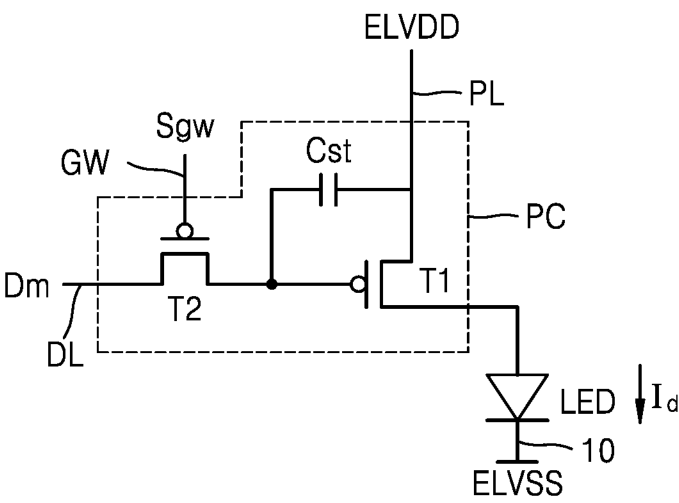
FIG. 2 is an equivalent circuit diagram schematically illustrating an embodiment of light-emitting diodes respectively corresponding to a first sub-pixel, a second sub-pixel, and a third sub-pixel of a display apparatus and sub-pixel circuits electrically connected to the light-emitting diodes.

FIG. 2 is an equivalent circuit diagram schematically illustrating an embodiment of light-emitting diodes respectively corresponding to a first sub-pixel, a second sub-pixel, and a third sub-pixel of a display apparatus and sub-pixel circuits electrically connected to the light-emitting diodes.

Referring to FIG. 2, a light-emitting diode LED may be electrically connected to a sub-pixel circuit PC, and the sub-pixel circuit PC may include a first transistor T1, a second transistor T2, and a storage capacitor Cst. A sub-pixel electrode (e.g., an anode) of the light-emitting diode LED may be electrically connected to the first transistor T1, and a counter electrode (e.g., a cathode) may be electrically connected to a common voltage supply line 10 and may receive a voltage corresponding to a common voltage ELVSS.

The second transistor T2 transmits, to the first transistor T1, a data signal Dm input through a data line DL according to a scan signal Sgw input through a scan line GW.

The storage capacitor Cst is connected to the second transistor T2 and a driving voltage line PL, and stores a voltage corresponding to a difference between a voltage received from the second transistor T2 and a driving voltage ELVDD supplied to the driving voltage line PL.

The first transistor T1 may be connected to the driving voltage line PL and the storage capacitor Cst, and may control driving current $I_d$ flowing through the light-emitting diode LED from the driving voltage line PL in response to a value of the voltage stored in the storage capacitor Cst. The light-emitting diode LED may emit light having a predetermined luminance due to the driving current $I_d$.

Although the sub-pixel circuit PC includes two transistors and one storage capacitor in FIG. 2, the disclosure is not limited thereto. The sub-pixel circuit PC of the display apparatus in another embodiment may include three or more transistors and two or more capacitors.

Figure 3:
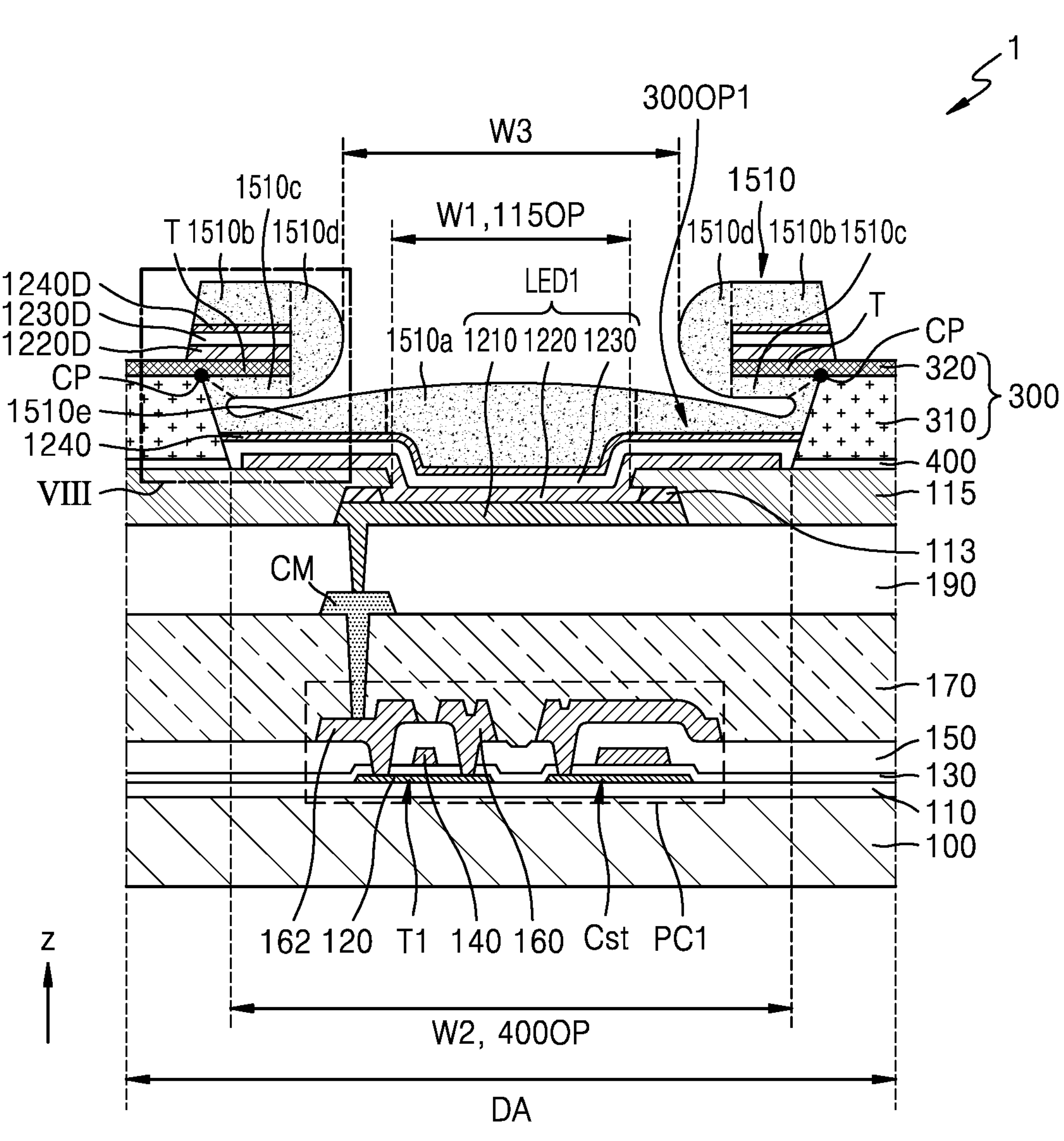
FIG. 3 is a cross-sectional view illustrating an embodiment of a display apparatus, especially illustrating a structure corresponding to a first light-emitting diode provided in the display apparatus.
Figure 4:
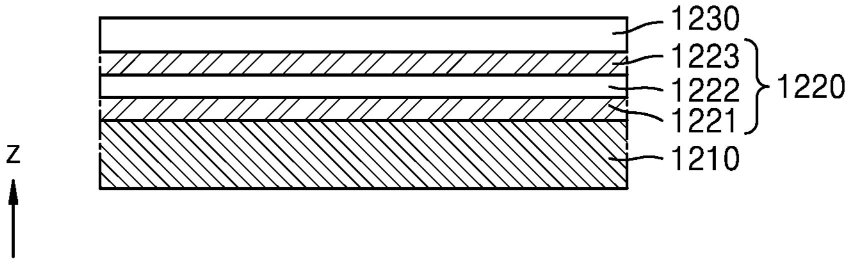
FIG. 4 is a cross-sectional view schematically illustrating an embodiment of a stacked structure of a first light-emitting diode included in a display apparatus.

FIG. 3 is a cross-sectional view illustrating an embodiment of a display apparatus, especially illustrating a structure corresponding to a first light-emitting diode provided in the display apparatus. FIG. 4 is a cross-sectional view schematically illustrating an embodiment of a stacked structure of a first light-emitting diode included in a display apparatus.

Referring to FIG. 3, the display area DA of the display apparatus 1 may include a first light-emitting diode LED1 disposed on a substrate 100. The first light-emitting diode LED1 may include a first sub-pixel electrode 1210, a first intermediate layer 1220 on the first sub-pixel electrode 1210, and a first counter electrode 1230 on the first intermediate layer 1220, and may emit light of a first color.

The substrate 100 may include a glass material or a polymer resin. The substrate 100 may have a structure in which a base layer including a polymer resin and an inorganic barrier layer are stacked. In embodiments, the polymer resin may include polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate, cellulose triacetate ("TAC"), and cellulose acetate propionate ("CAP"), for example.

The first light-emitting diode LED1 may be electrically connected to a first sub-pixel circuit PC1 disposed between the substrate 100 and the first light-emitting diode LED1. The first sub-pixel circuit PC1 may include a transistor and a storage capacitor as described with reference to FIG. 2. In an embodiment, FIG. 3 illustrates the first transistor T1 and the storage capacitor Cst of the first sub-pixel circuit PC1.

A buffer layer 110 may be disposed between the substrate 100 and the first transistor T1. The buffer layer 110 may prevent penetration of impurities into a semiconductor layer of the transistor. The buffer layer 110 may include an inorganic insulating material such as silicon nitride, silicon oxynitride, and/or silicon oxide, and may have a single or multi-layer structure including the above inorganic insulating material.

The first transistor T1 may include a first semiconductor layer 120 on the buffer layer 110 and a first gate electrode 140 overlapping a channel region of the first semiconductor layer 120. The first semiconductor layer 120 may include a silicon-based semiconductor material, e.g., polysilicon. In an alternative embodiment, the first semiconductor layer 120 may include an oxide-based semiconductor material. The first semiconductor layer 120 may include the channel region and a first region and a second region disposed on opposite sides of the channel region. The first region and the second region are regions having a higher impurity concentration than that of the channel region, and one of the first region and the second region may correspond to a source region and the other may correspond to a drain region.

A gate insulating layer 130 may be disposed between the first semiconductor layer 120 and the first gate electrode 140. The gate insulating layer 130 may include an inorganic insulating material such as silicon nitride, silicon oxynitride, and/or silicon oxide, and may have a single or multi-layer structure including the above inorganic insulating material.

A first inter-insulating layer 150 may be disposed on the first gate electrode 140. The first inter-insulating layer 150 may include an inorganic insulating material such as silicon nitride, silicon oxynitride, and/or silicon oxide, and may have a single or multi-layer structure including the above inorganic insulating material.

A source electrode 160 and a drain electrode 162 may be electrically connected to the source region and the drain region of the first semiconductor layer 120, respectively. A first organic insulating layer 170 may be disposed on the source electrode 160 and the drain electrode 162. The first organic insulating layer 170 may include an organic insulating material. The storage capacitor Cst may include at least two capacitor electrodes overlapping each other. In an embodiment, FIG. 3 illustrates a first capacitor electrode in the same layer as the first semiconductor layer 120, a second capacitor electrode in the same layer as the first gate electrode 140, and a third capacitor electrode in the same layer as the source electrode 160 and/or the drain electrode 162. Each of the source electrode 160 and the drain electrode 162 may include aluminum (Al), copper (Cu), and/or titanium (Ti), and may have a single or multi-layer structure including the above material.

A connection metal CM may be disposed on the first organic insulating layer 170, and the first sub-pixel electrode 1210 of the first light-emitting diode LED1 may be connected to the connection metal CM through a contact hole defined in a second organic insulating layer 190. The connection metal CM may electrically connect the first sub-pixel circuit PC1 to the first sub-pixel electrode 1210 of the first light-emitting diode LED1. The first organic insulating layer 170 may include an organic insulating material such as acryl, benzocyclobutene ("BCB"), polyimide, and/or hexamethyldisiloxane ("HMDSO"). The connection metal CM may include aluminum (Al), copper (Cu), and/or titanium (Ti), and may have a single or multi-layer structure including the above material.

In another embodiment, the first sub-pixel electrode 1210 of the first light-emitting diode LED1 may be directly electrically connected to the first sub-pixel circuit PC1. In another embodiment, a plurality of connection metals disposed in different layers may be disposed between the first sub-pixel electrode 1210 of the first light-emitting diode LED1 and the first sub-pixel circuit PC1, and the first sub-pixel electrode 1210 of the first light-emitting diode LED1 may be electrically connected to the first sub-pixel circuit PC1 through the plurality of connection metals.

The first sub-pixel electrode 1210 of the first light-emitting diode LED1 may be disposed on the second organic insulating layer 190. The second organic insulating layer 190 may include an organic insulating material such as acryl, benzocyclobutene ("BCB"), polyimide, and/or hexamethyldisiloxane ("HMDSO").

The first sub-pixel electrode 1210 may include a metal and/or a conductive oxide. In an embodiment, the first sub-pixel electrode 1210 may include a reflective film including Ag, Mg, Al, Pt, Pd, Au, Ni, Nd, Ir, Cr, or any combinations thereof, and a film including or consisting of ITO, IZO, ZnO, or $In_2O_3$ under and/or over the reflective film, for example. In an embodiment, the first sub-pixel electrode 1210 may have a structure in which an ITO layer, a silver (Ag) layer, and an ITO layer are sequentially stacked.

A conductive protective layer 113 may be formed on the first sub-pixel electrode 1210. The conductive protective layer 113 may overlap an outer portion of the first sub-pixel electrode 1210, and an opening overlapping an inner portion of the first sub-pixel electrode 1210 may be defined in conductive protective layer 113. In the specification, the phrase "outer portion (or peripheral portion) of A" indicates "a portion of A including an edge of A", and the phrase "inner portion of A" indicates another portion of A surrounded by the outer portion (or peripheral portion).

The conductive protective layer 113 may prevent the first sub-pixel electrode 1210 from being damaged by a material used in various processes (e.g., an etching process or an ashing process) included in a process of manufacturing the display apparatus 1. The conductive protective layer 113 may include at least one conductive oxide of indium tin oxide ("ITO"), indium zinc oxide ("IZO"), indium gallium zinc oxide ("IGZO"), indium tin zinc oxide ("ITZO"), zinc oxide (ZnO), aluminum-doped zinc oxide ("AZO"), gallium-doped zinc oxide ("GZO"), zinc tin oxide ("ZTO"), gallium tin oxide ("GTO"), and fluorine-doped tin oxide ("FTO").

A conductive bank layer 300 may be disposed on the first sub-pixel electrode 1210 with an insulating layer 115 therebetween. A first opening 300OP1 may pass through the conductive bank layer 300 in a thickness direction (e.g., z direction) of the conductive bank layer 300. The first opening 300OP1 of the conductive bank layer 300 may overlap the first sub-pixel electrode 1210.

The insulating layer 115 may electrically insulate the conductive bank layer 300 from the first sub-pixel electrode 1210. The insulating layer 115 may be formed on an entirety of the substrate 100. In an embodiment, the insulating layer 115 may pass through an overlapping structure of the first sub-pixel electrode 1210 and the conductive protective layer 113 and may directly contact a top surface of the second organic insulating layer 190 on which the conductive protective layer 113 is not disposed, for example. The insulating layer 115 may cover a side surface of each of the first sub-pixel electrode 1210 and the conductive protective layer 113. The insulating layer 115 may include an inorganic insulating material. When the insulating layer 115 includes an inorganic insulating material, compared to a case where the insulating layer 115 includes an organic insulating material, degradation in the quality of a light-emitting diode due to gas emitted from the insulating layer that includes an organic insulating material during a process of manufacturing the display apparatus may be prevented or minimized.

The insulating layer 115 may include an inorganic insulating material such as silicon oxide, silicon nitride, and/or silicon oxynitride, and may have a single or multi-layer structure including the above inorganic insulating material. An opening 115OP overlapping the first opening 300OP1 of the conductive bank layer 300 and the first sub-pixel electrode 1210 may be defined in the insulating layer 115. A width W1 of the opening 115OP of the insulating layer 115 may be less than a width of the first opening 300OP1. In an embodiment, the width W1 of the opening 115OP of the insulating layer 115 may be less than a width of an opening of a first conductive layer 310, and less than a width of an opening of a second conductive layer 320, for example.

An insulating protective layer 400 may be disposed between the conductive bank layer 300 and the insulating layer 115. The insulating protective layer 400 may prevent the first sub-pixel electrode 1210 from being damaged by a gas or liquid material used in various processes (e.g., an etching process or an ashing process) included in a process of manufacturing the display apparatus 1.

The insulating protective layer 400 may include an amorphous inorganic insulating material such as silicon oxide and/or silicon nitride. The insulating protective layer 400 may include a material having an etch selectivity different from that of the conductive protective layer 113, the insulating layer 115, and the conductive bank layer 300 from among the above inorganic insulating materials. The insulating protective layer 400 may have a molecular structure different from that of the conductive protective layer 113, and may have chemical resistance different from that of the conductive protective layer 113. The insulating protective layer 400 may prevent an etchant from damaging the first sub-pixel electrode 1210 through a crystal structure (e.g., a pin hole of the conductive protective layer) of the conductive protective layer 113 in an etching process (e.g., a wet etching process) for forming an overhang structure of the conductive bank layer 300 in a process of manufacturing the display apparatus 1.

An opening 400OP overlapping the first opening 300OP1 of the conductive bank layer 300, the first sub-pixel electrode 1210, and the opening 115OP of the insulating layer 115 may be defined in the insulating protective layer 400. A width W2 of the opening 400OP of the insulating protective layer 400 may be greater than the width W1 of the opening 115OP of the insulating layer 115.

The first intermediate layer 1220 may directly contact the first sub-pixel electrode 1210 through the opening 115OP of the insulating layer 115. In an embodiment, an inner portion of the first intermediate layer 1220 may overlap and contact the first sub-pixel electrode 1210, and an outer portion of the first intermediate layer 1220 may extend to the insulating layer 115 and may overlap and contact the insulating layer 115, for example. The first intermediate layer 1220 disposed between the first counter electrode 1230 and the first sub-pixel electrode 1210 may emit light of a first color. The width W1 of the opening 115OP of the insulating layer 115 may correspond to a width of an emission area of the first light-emitting diode LED1.

The first intermediate layer 1220 may include a first emission layer 1222 as shown in FIG. 4. The first intermediate layer 1220 may include a common layer disposed between the first sub-pixel electrode 1210 and the first emission layer 1222 and/or between the first emission layer 1222 and a first counter electrode 1230. Hereinafter, the common layer between the first sub-pixel electrode 1210 and the first emission layer 1222 is also referred to as a first common layer 1221, and the common layer between the first emission layer 1222 and the first counter electrode 1230 is also referred to as a second common layer 1223.

The first emission layer 1222 may include a relatively high molecular weight organic material or a relatively low molecular weight organic material that emits light of a predetermined color (e.g., red light, green light, or blue light). In another embodiment, the first emission layer 1222 may include an inorganic material or quantum dots.

The first common layer 1221 may include a hole transport layer ("HTL") and/or a hole injection layer ("HIL"). The second common layer 1223 may include an electron transport layer ("ETL") and/or an electron injection layer ("EIL"). Each of the first common layer 1221 and the second common layer 1223 may include an organic material.

The first counter electrode 1230 may include or consist of a conductive material having a relatively low work function. In an embodiment, the first counter electrode 1230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloys thereof. In an alternative embodiment, the first counter electrode 1230 may further include a layer including or consisting of ITO, IZO, ZnO, and/or $In_2O_3$ on the (semi-) transparent layer including the above material.

As shown in FIG. 3, an inner portion of the first counter electrode 1230 may overlap the first intermediate layer 1220 and the first sub-pixel electrode 1210, and an outer portion of the first counter electrode 1230 may extend to the insulating layer 115 and may overlap the insulating layer 115. A width of the first counter electrode 1230 may be greater than a width of the first intermediate layer 1220. In other words, the outer portion of the first counter electrode 1230 may further extend past an edge of the first intermediate layer 1220 and may directly contact the conductive bank layer 300. In an embodiment, as shown in FIG. 3, the outer portion of the first counter electrode 1230 may directly contact a part of a side surface (e.g., a lower portion of the side surface) of the first conductive layer 310 of the conductive bank layer 300, for example. The first counter electrode 1230 may be protected by a first capping layer 1240 disposed over the first counter electrode 1230. The first capping layer 1240 may include an organic material or an inorganic material. An outer portion of the first capping layer 1240 may extend past an edge of the first counter electrode 1230 and may directly contact the conductive bank layer 300.

The conductive bank layer 300 may include conductive layers having different etch selectivities. In an embodiment, the conductive bank layer 300 may include the first conductive layer 310 and the second conductive layer 320 on the first conductive layer 310. The first conductive layer 310 and the second conductive layer 320 may include metals having different etch selectivities. In an embodiment, the first conductive layer 310 may be a layer including aluminum (Al), and the second conductive layer 320 may be a layer including titanium (Ti). Although the conductive bank layer 300 includes two conductive layers in FIG. 3, the disclosure is not limited thereto. In another embodiment, the conductive bank layer 300 may further include the first conductive layer 310, the second conductive layer 320 on the first conductive layer 310, and a third conductive layer under the first conductive layer 310.

A thickness of the first conductive layer 310 may be greater than a thickness of the second conductive layer 320. In an embodiment, a thickness of the first conductive layer 310 may be greater than about five times and less than about ten times a thickness of the second conductive layer 320. In some embodiments, a thickness of the first conductive layer 310 may be about six times or greater than about six times, about seven times or greater than about seven times, or about eight times or greater than about eight times a thickness of the second conductive layer 320. In an embodiment, a thickness of the first conductive layer 310 may range from about 0.5 micrometer (μm) to about 1 μm, and a thickness of the second conductive layer 320 may range from about 0.03 μm to about 0.15 μm.

The conductive bank layer 300 may include an overhang structure. In an embodiment, the second conductive layer 320 of the conductive bank layer 300 may protrude more than the first conductive layer 310 toward the first opening 300OP1 of the conductive bank layer 300 to form an overhang structure, for example. In other words, the second conductive layer 320 may include a tip T protruding in one direction (e.g., a direction or a lateral direction toward the first opening 300OP) from a point CP at which a bottom surface of the second conductive layer 320 and a side surface of the first conductive layer 310 meet each other.

The first intermediate layer 1220 may be formed through a deposition process. When the conductive bank layer 300 has an overhang structure, a material for forming the first intermediate layer 1220 may be deposited on the first sub-pixel electrode 1210 as shown in FIG. 3 or may also be deposited on a top surface of the conductive bank layer 300 as shown in FIG. 3. The material deposited on the first sub-pixel electrode 1210 may correspond to the first intermediate layer 1220, and the material deposited on the top surface of the conductive bank layer 300 may correspond to a first dummy intermediate layer 1220D.

Like the first intermediate layer 1220, each of the first counter electrode 1230 and the first capping layer 1240 may be formed through deposition, and a first dummy counter electrode 1230D and a first dummy capping layer 1240D may be disposed on the top surface of the conductive bank layer 300. The first dummy counter electrode 1230D may be disposed on the first dummy intermediate layer 1220D, and the first dummy capping layer 1240D may be disposed on the first dummy counter electrode 1230D.

A first inorganic barrier layer 1510 may overlap and cover the first light-emitting diode LED1. The first inorganic barrier layer 1510 may include at least one inorganic insulating material of aluminum oxide, titanium oxide, tantalum oxide, hafnium oxide, zinc oxide, silicon oxide, silicon nitride, and silicon oxynitride, and may be deposited by a method such as chemical vapor deposition.

The first inorganic barrier layer 1510 may have better step coverage than that of the first intermediate layer 1220 and the first counter electrode 1230 and thus, may not be separated or disconnected by the overhang structure of the conductive bank layer 300. The first inorganic barrier layer 1510 may continuously overlap and cover a top surface and a side surface of the conductive bank layer 300 and the first light-emitting diode LED1.

For convenience of explanation, different portions of the first inorganic barrier layer 1510 will be described as first to fifth portions according to positions. In an embodiment, the first inorganic barrier layer 1510 may include a first portion 1510*a* overlapping the first light-emitting diode LED1, a second portion 1510*b* on a top surface of the conductive bank layer 300, e.g., on a top surface of the tip T, a third portion 1510*c* on a bottom surface of the tip T of the conductive bank layer 300, a fourth portion 1510*d* between the second portion 1510*b* and the third portion 1510*c*, and a fifth portion 1510*e* between the first portion 1510*a* and the third portion 1510*c*. The fifth portion 1510*e* may overlap a side surface of the first conductive layer 310, and may overlap an outer portion of the first intermediate layer 1220, an outer portion of the first counter electrode 1230, and an outer portion of the first capping layer 1240. The first portion 1510*a* may be unitarily extended to the fifth portion 1510*e*, the fifth portion 1510*e* may be unitarily extended to the third portion 1510*c*, the third portion 1510*c* may be unitarily extended to the fourth portion 1510*d*, and the fourth portion 1510*d* may be unitarily extended to the second portion 1510*b*.

In a cross-sectional view, the fourth portion 1510*d* of the first inorganic barrier layer 1510 may protrude in a protruding direction (e.g., a direction or a lateral direction perpendicular to a z direction) of the tip T. In an embodiment, as shown in FIG. 3, the fourth portion 1510*d* of the first inorganic barrier layer 1510 may include a round surface in the protruding direction (e.g., a direction or a lateral direction perpendicular to the z direction) of the tip T.

In other words, in a cross-sectional view, the fourth portions 1510*d* of the first inorganic barrier layer 1510 may be disposed on opposite sides of a virtual vertical line passing through the center of the first light-emitting diode LED1, and a separation area between the fourth portions 1510*d* may overlap the emission area of the first light-emitting diode LED1. A width W3 of the separation area may be greater than a width of the emission area of the first light-emitting diode LED1, e.g., the width W1 of the opening 115OP of the insulating layer 115. In FIG. 3, the separation area between the fourth portions 1510*d* may correspond to a width of an area surrounded by the fourth portion 1510*d* in a plan view (when projected in a direction perpendicular to a top surface of the substrate 100). In other words, in a plan view (when viewed in a direction perpendicular to the top surface of the substrate 100), the fourth portion 1510*d* may have a closed loop shape surrounding the emission area.

When projected in a direction perpendicular to the top surface of the substrate 100 or a top surface of the first sub-pixel electrode 1210, the first portion 1510*a* may not overlap the fourth portion 1510*d*. In a comparative example, when the fourth portion 1510*d* of the first inorganic barrier layer 1510 overlaps the first portion 1510*a* when projected in a direction perpendicular to the top surface of the substrate 100 or the top surface of the first sub-pixel electrode 1210, color deviation occurs between light emitted from a central portion of the first light-emitting diode LED1 and light emitted from an outer portion. In a comparative example, because light emitted from the central portion of the first light-emitting diode LED1 passes through the first portion 1510*a* of the first inorganic barrier layer 1510 whereas light emitted from the outer portion of the first light-emitting diode LED1 passes through the first portion 1510*a* and the fourth portion 1510*d* of the first inorganic barrier layer 1510, color deviation may occur therebetween, for example.

However, in an embodiment, because the fourth portion 1510*d* of the first inorganic barrier layer 1510 does not overlap the first portion 1510*a* when projected in a direction perpendicular to a top surface of the first sub-pixel electrode 1210, color deviation may be prevented.

Figure 5:
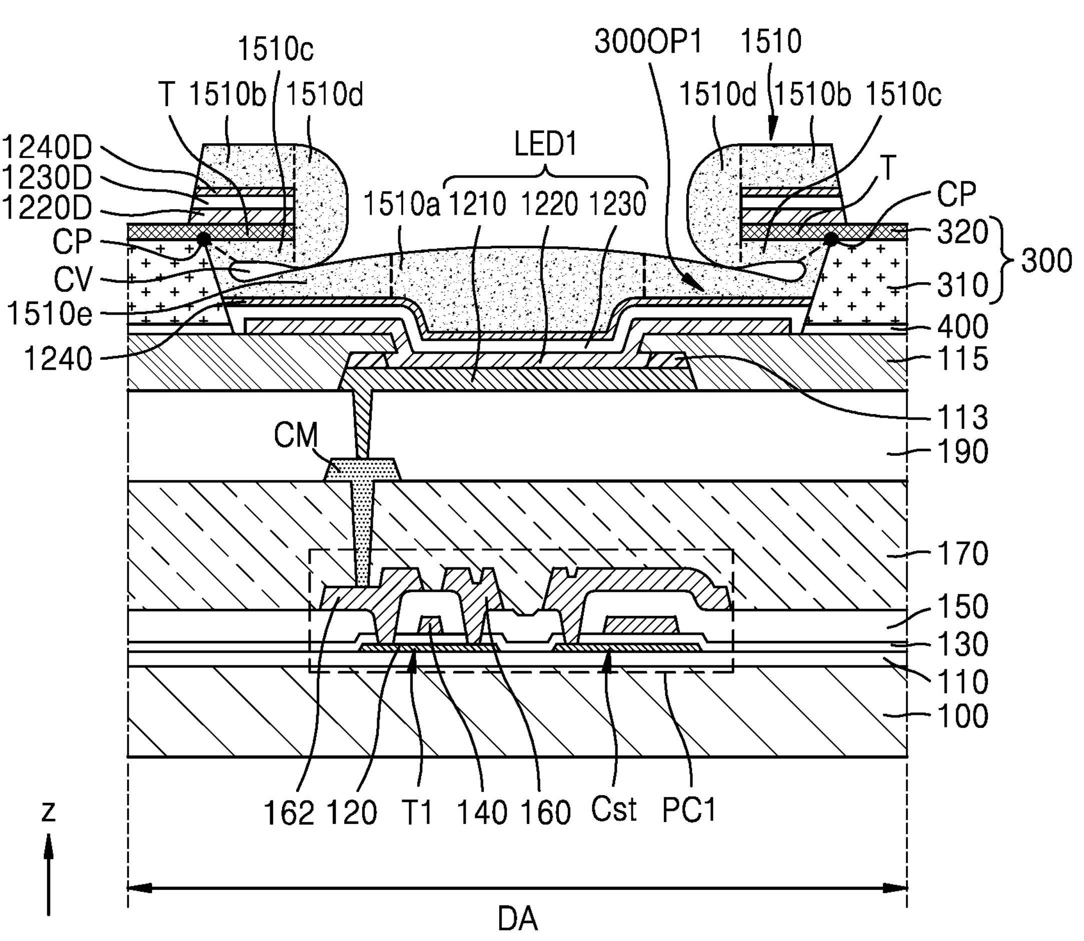
FIG. 5 is a cross-sectional view illustrating an embodiment of a display apparatus.

FIG. 5 is a cross-sectional view illustrating another embodiment of a display apparatus. Because a structure other than a structure of the first inorganic barrier layer 1510 of the display apparatus 1 is substantially the same as a structure of the display apparatus 1 of FIG. 3, for convenience of explanation, a difference will be mainly described.

Referring to FIG. 5, the fourth portion 1510*d* of the first inorganic barrier layer 1510 may contact the fifth portion 1510*e*. In this case, a cavity CV may be defined under the tip T. The cavity CV may be defined between the third portion 1510*c* and the fifth portion 1510*e* of the first inorganic barrier layer 1510.

FIGS. 6A to 6J are cross-sectional views schematically illustrating an embodiment of a state according to a process of manufacturing the display apparatus 1.

Figure 6A:
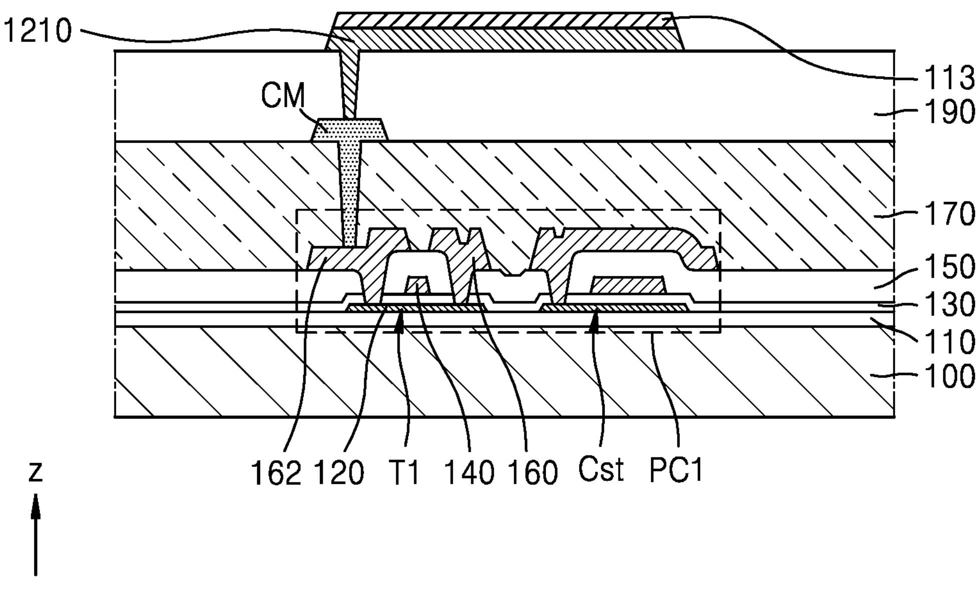
FIGS. 6A to 6J are cross-sectional views schematically illustrating an embodiment of a state according to a process of manufacturing a display apparatus.

Referring to FIG. 6A, the first sub-pixel circuit PC1 may be formed on the substrate 100. The buffer layer 110 may be formed on the substrate 100 before the first sub-pixel circuit PC1 is formed.

The first transistor T1 and the storage capacitor Cst may be formed on the buffer layer 110. The first transistor T1 may include a first semiconductor layer 120 on the buffer layer 110 and a first gate electrode 140 overlapping a channel region of the first semiconductor layer 120, and the gate insulating layer 130 may be formed between the first semiconductor layer 120 and the first gate electrode 140.

The first inter-insulating layer 150 may be formed on the first gate electrode 140, and the source electrode 160 and the drain electrode 162 may be formed on the first inter-insulating layer 150. The source electrode 160 and the drain electrode 162 may be electrically connected to the first semiconductor layer 120 through a contact hole passing through the first inter-insulating layer 150, e.g., a contact hole passing through the first inter-insulating layer 150 and the gate insulating layer 130.

The first organic insulating layer 170 may be formed on the first transistor T1, and the connection metal CM may be formed on the first organic insulating layer 170 and may be electrically connected to the first transistor T1 through a contact hole passing through the first organic insulating layer 170. The second organic insulating layer 190 may be formed on the connection metal CM.

The first sub-pixel electrode 1210 may be formed on the second organic insulating layer 190. The first sub-pixel electrode 1210 may include a metal and/or a conductive oxide. In an embodiment, the first sub-pixel electrode 1210 may include a reflective film including Ag, Mg, Al, Pt, Pd, Au, Ni, Nd, Ir, Cr, or any combinations thereof and a film including or consisting of ITO, IZO, ZnO, or $In_2O_3$ under and/or over the reflective film, for example, as described with reference to FIG. 3.

The conductive protective layer 113 may be formed on the first sub-pixel electrode 1210. The conductive protective layer 113 may be patterned in the same mask process as the first sub-pixel electrode 1210, and the first sub-pixel electrode 1210 and the conductive protective layer 113 may have an isolated shape in the display area DA. The conductive protective layer 113 may include a conductive oxide such as ITO, IZO, IGZO, ITZO, ZnO, AZO, GZO, ZTO, GTO, or FTO as described with reference to FIG. 3.

Figure 6B:
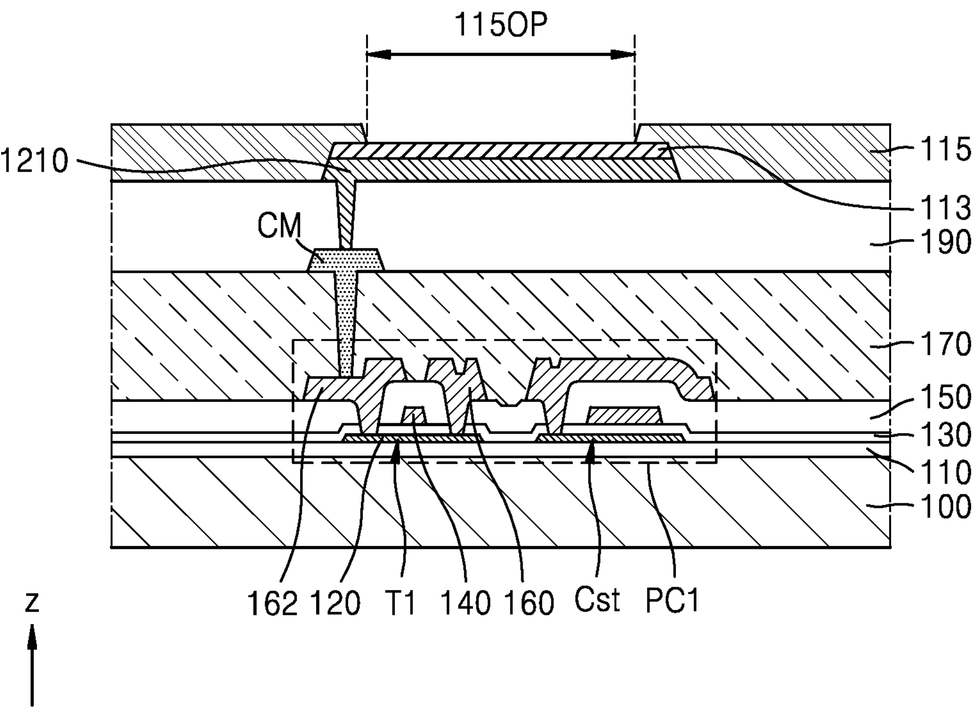

Referring to FIG. 6B, the insulating layer 115 may be formed on a stacked structure of the first sub-pixel electrode 1210 and the conductive protective layer 113. The insulating layer 115 may cover an edge of the stacked structure of the first sub-pixel electrode 1210 and the conductive protective layer 113, and the opening 115OP overlapping an inner portion of the stacked structure may be defined in the insulating layer 115. The insulating layer 115 may include an inorganic insulating material as described with reference to FIG. 3.

Figure 6C:
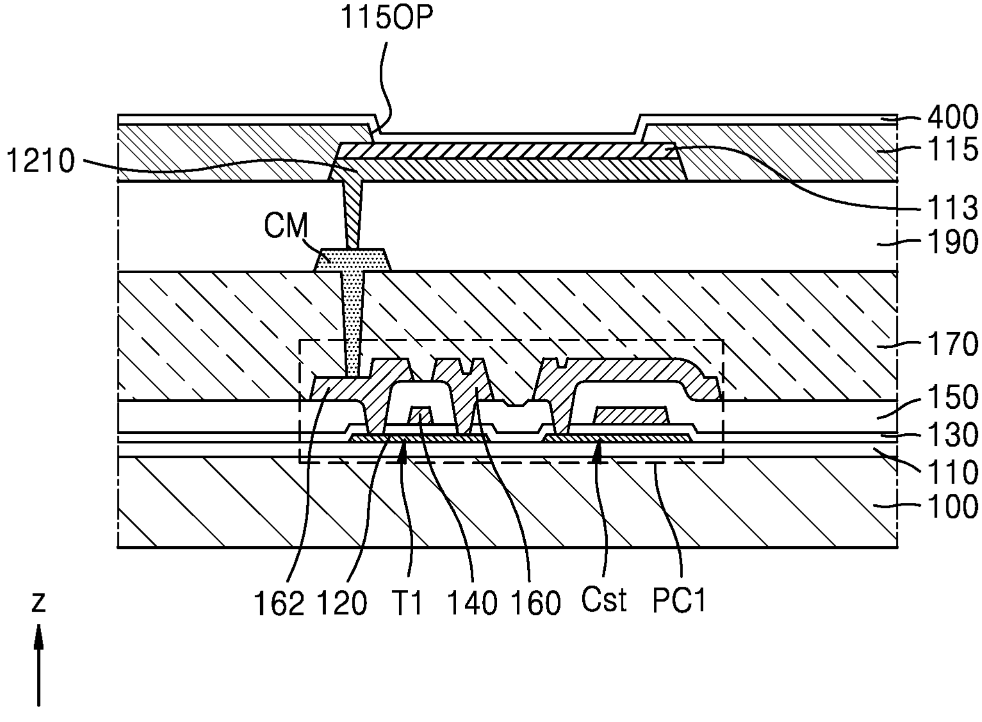

Referring to FIG. 6C, the insulating protective layer 400 is formed on the insulating layer 115. The insulating protective layer 400 may include a material, e.g., an inorganic insulating material, having an etch selectivity different from that of the conductive protective layer 113 and the insulating layer 115. In an embodiment, the conductive protective layer 113 may include a conductive oxide such as IGZO, the insulating layer 115 may include an inorganic insulating material (e.g., an amorphous inorganic insulating material) such as silicon nitride, and the insulating protective layer 400 may include silicon oxide. A thickness of the insulating protective layer 400 may be less than a thickness of the insulating layer 115. The insulating protective layer 400 may directly contact a top surface of the conductive protective layer 113 through the opening 115OP of the insulating layer 115.

Figure 6D:
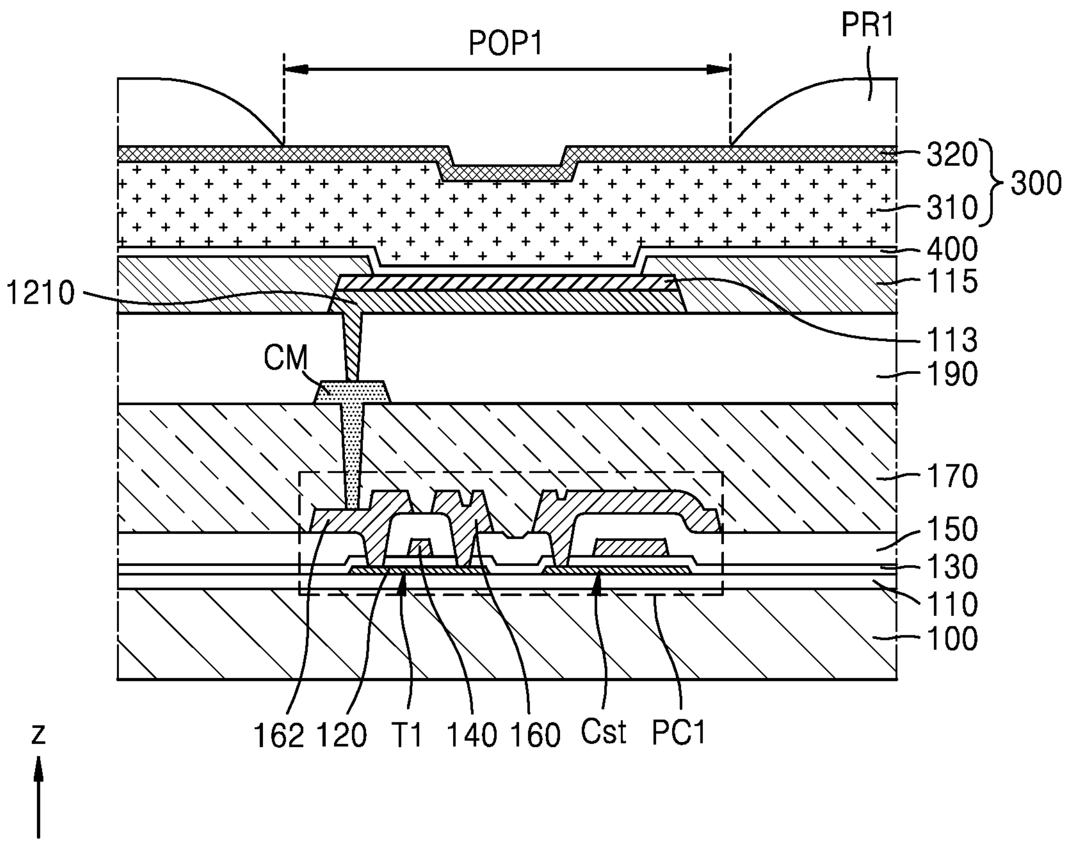

Referring to FIG. 6D, conductive layers corresponding to the conductive bank layer 300 may be formed on the insulating protective layer 400. In an embodiment, FIG. 6D illustrates the first conductive layer 310 and the second conductive layer 320 on the first conductive layer 310.

The first conductive layer 310 and the second conductive layer 320 may include conductive materials having different etch selectivities. In an embodiment, the first conductive layer 310 may be a layer including aluminum (Al), and the second conductive layer 320 may be a layer including titanium (Ti). A thickness of the first conductive layer 310 may be about six times or greater than about six times, about seven times or greater than about seven times, or about eight times or greater than about eight times a thickness of the second conductive layer 320. In an embodiment, a thickness of the first conductive layer 310 may range from about 0.5 μm to about 1 μm, and a thickness of the second conductive layer 320 may range from about 0.03 μm to about 0.15 μm.

Although the conductive bank layer 300 includes two conductive layers in FIG. 6D, the disclosure is not limited thereto. In another embodiment, the conductive bank layer 300 may include the first conductive layer 310, the second conductive layer 320 on the first conductive layer 310, and a third conductive layer under the first conductive layer 310.

Next, a first photoresist PR1 in which a first opening area POP1 is defined may be formed on the conductive bank layer 300. The first opening area POP1 of the first photoresist PR1 may overlap the first sub-pixel electrode 1210.

Figure 6E:
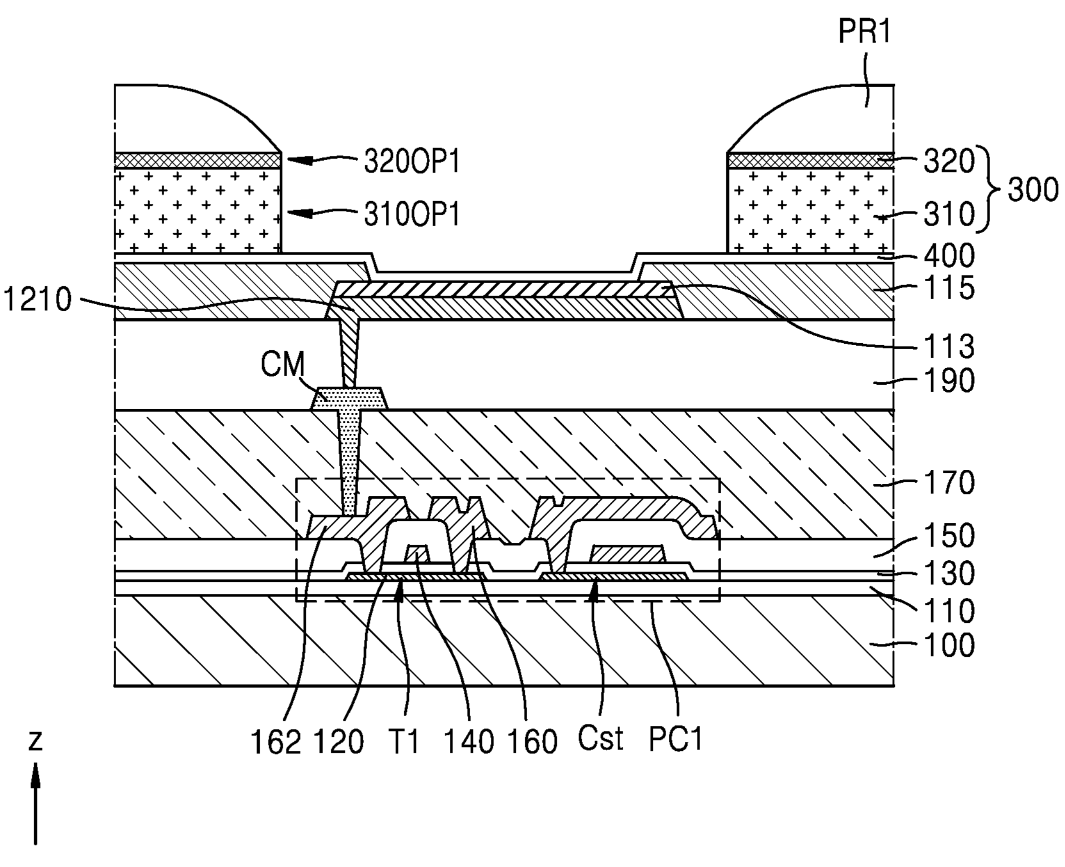

Referring to FIG. 6E, a part of the second conductive layer 320 and a part of the first conductive layer 310 may be removed by the first photoresist PR1 as a mask. A part of the second conductive layer 320 and a part of the first conductive layer 310 may be removed by dry etching. During an etching process, the insulating protective layer 400 and the conductive protective layer 113 may protect the first sub-pixel electrode 1210 under the insulating protective layer 400 and the conductive protective layer 113.

As a part of the second conductive layer 320 and a part of the first conductive layer 310 are removed, an opening 320OP1 passing through the second conductive layer 320 and overlapping the first sub-pixel electrode 1210 may be defined in the second conductive layer 320 and an opening 310OP1 passing through the first conductive layer 310 and overlapping the first sub-pixel electrode 1210 may be defined in the first conductive layer 310.

Figure 6F:
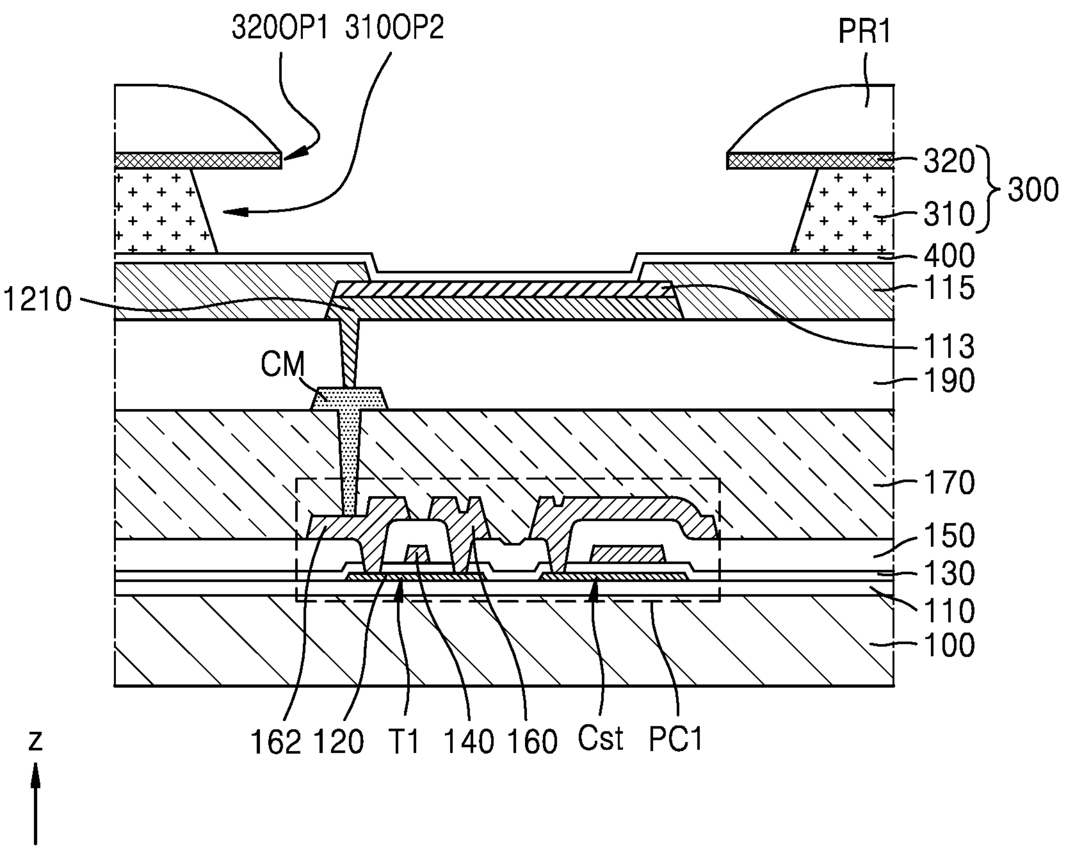

Referring to FIG. 6F, an overhang structure of the conductive bank layer 300 is formed. In an embodiment, the first conductive layer 310 may be further etched through etching, for example. An opening 310OP2 having a width greater than that of the opening 310OP1 of the first conductive layer 310 defined in the process of FIG. 6E may be defined in the first conductive layer 310 through etching.

In some embodiments, the opening 310OP2 of the first conductive layer 310 may have a shape in which a width decreases downward. In an embodiment, a width of an upper portion of the opening 310OP2 of the first conductive layer 310 may be greater than a width of a lower portion, for example. In other words, a side surface of the first conductive layer 310 facing the opening 310OP2 may have a forward tapered inclination.

In some embodiments, the opening 310OP2 of the first conductive layer 310 may be defined through wet etching. Because the first conductive layer 310 and the second conductive layer 320 include metals having different etch selectivities, a part of the first conductive layer 310 may be removed in a wet etching process, and the opening 310OP2 of the first conductive layer 310 having a width greater than that of the opening 320OP1 of the second conductive layer 320 may be defined. During an etching process for defining the opening 310OP2 of the first conductive layer 310, the insulating protective layer 400 and the conductive protective layer 113 may protect the first sub-pixel electrode 1210.

In a comparative example, when the insulating protective layer 400 does not exist, an etchant may pass through a fine hole (e.g., a pin hole) of the conductive protective layer 113 to damage the first sub-pixel electrode 1210 in an etching process (e.g., wet etching) for forming an overhang structure of the conductive bank layer 300 as described above. However, in an embodiment, because the insulating protective layer 400 overlaps the first sub-pixel electrode 1210 and the conductive protective layer 113, the above problem may be prevented or minimized. Next, the first photoresist PR1 is removed.

Figure 6G:
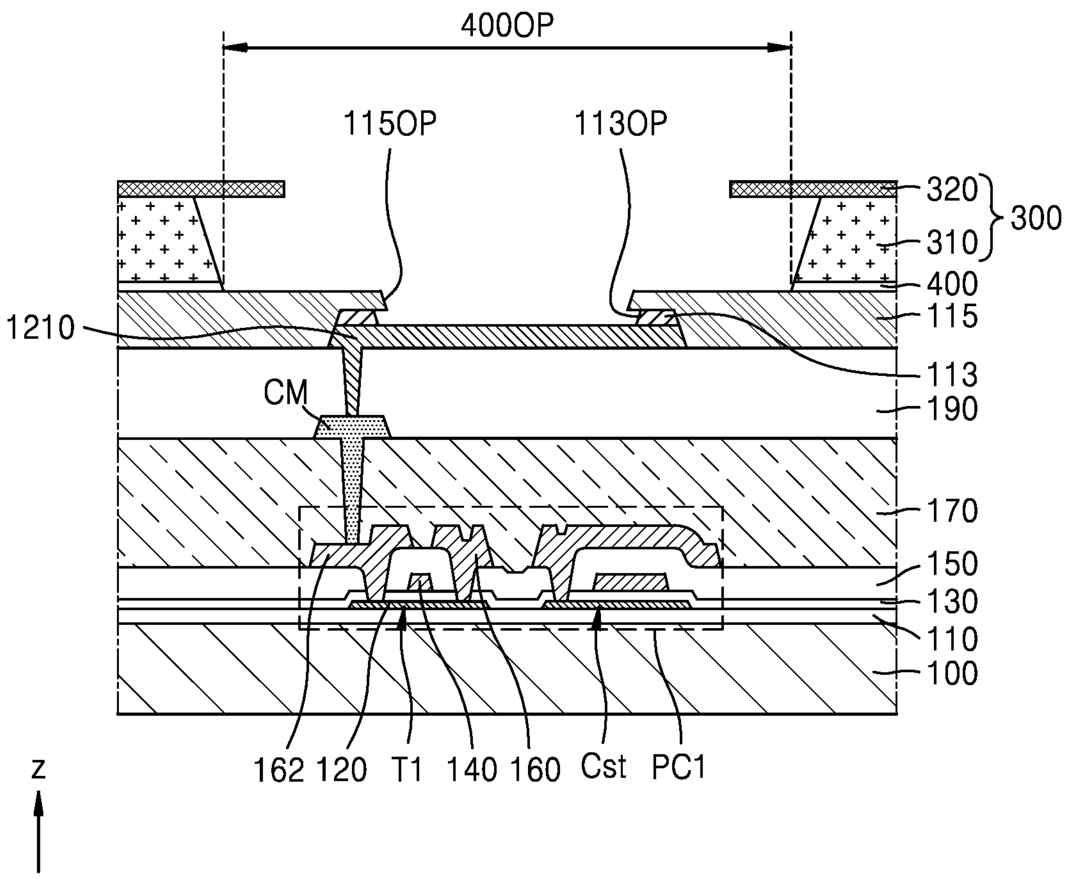

Referring to FIG. 6G, after the conductive bank layer 300 having the overhang structure is formed, the opening 400OP may be defined by removing a part of the insulating protective layer 400. The opening 400OP of the insulating protective layer 400 may be defined by etching, e.g., dry etching.

Next, an opening 113OP may be defined by removing a part of the conductive protective layer 113 through the opening 400OP of the insulating protective layer 400. The opening 113OP of the conductive protective layer 113 may be defined by an etching process, e.g., wet etching, different from an etching process for defining the opening 400OP of the insulating protective layer 400. Because the conductive protective layer 113 has an etch selectivity different from that of the insulating protective layer 400, etching for defining the opening 400OP of the insulating protective layer 400 and etching for defining the opening 113OP of the conductive protective layer 113 may be independently or individually performed.

Although the first photoresist PR1 is removed and then the opening 400OP of the insulating protective layer 400 is defined and the opening 113OP of the conductive protective layer 113 is defined in FIGS. 6F and 6G, the disclosure is not limited thereto. In another embodiment, after the opening 400OP of the insulating protective layer 400 is defined and the opening 113OP of the conductive protective layer 113 is defined, the first photoresist PR1 may be removed.

Figure 6H:
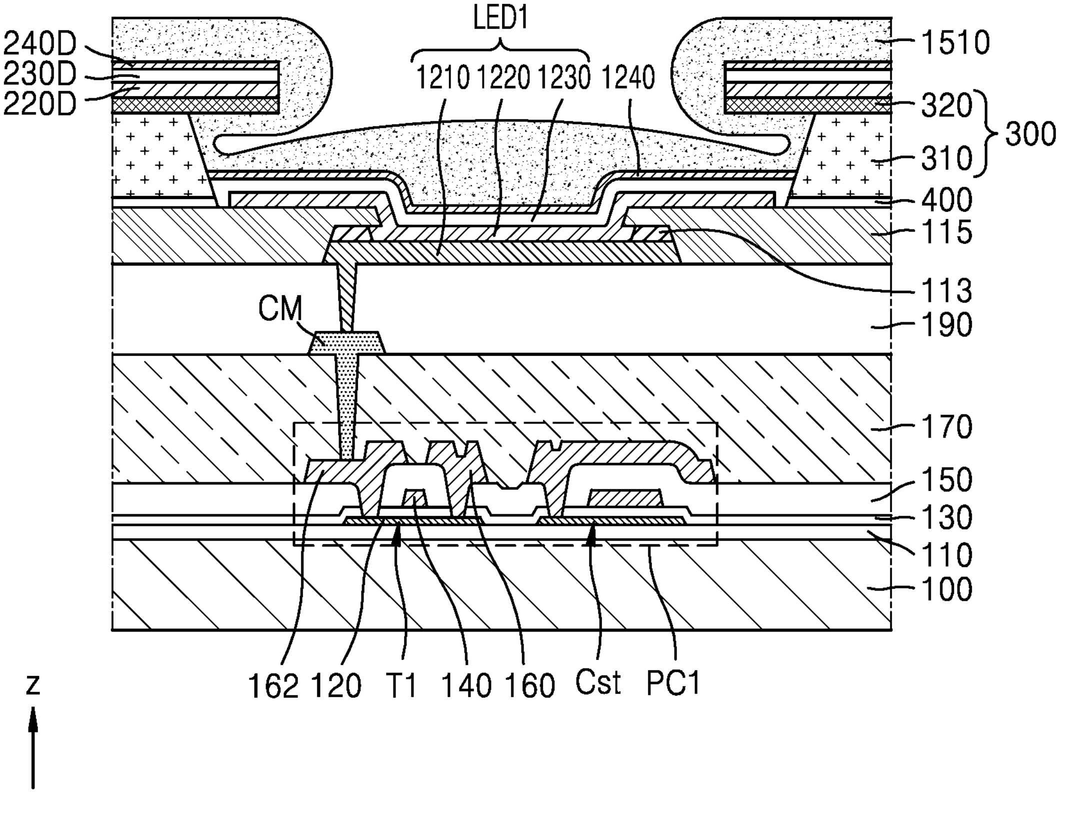

Referring to FIG. 6H, the first intermediate layer 1220 and the first counter electrode 1230 are formed. A stacked structure of the first sub-pixel electrode 1210, the first intermediate layer 1220, and the first counter electrode 1230 corresponds to the first light-emitting diode LED1. In some embodiments, the first intermediate layer 1220 and the first counter electrode 1230 may be formed through a deposition method such as thermal evaporation.

Because the first intermediate layer 1220 and the first counter electrode 1230 are deposited without a separate mask, a deposition material for forming the first intermediate layer 1220 and a deposition material for forming the first counter electrode 1230 may be used to form the first dummy intermediate layer 1220D and the first dummy counter electrode 1230D on the conductive bank layer 300. The first intermediate layer 1220 and the first dummy intermediate layer 1220D may be separated and spaced apart from each other, and the first counter electrode 1230 and the first dummy counter electrode 1230D may be separated and spaced apart from each other. The first intermediate layer 1220 and the first dummy intermediate layer 1220D may include the same material and/or the same number of sub-layers (e.g., a first common layer, an emission layer, and a second common layer). The first counter electrode 1230 and the first dummy counter electrode 1230D may include the same material.

An outer portion including an edge of the first counter electrode 1230 may extend past an edge of the first intermediate layer 1220 and may directly contact a side surface of the first conductive layer 310. The first conductive layer 310 and the first counter electrode 1230 may be electrically connected to each other.

The first capping layer 1240 may be formed on the first counter electrode 1230. The first capping layer 1240 may be deposited without a separate mask, like the first counter electrode 1230. A part of a deposition material for forming the first capping layer 1240 may be used to form the first dummy capping layer 1240D disposed on the first dummy counter electrode 1230D on the conductive bank layer 300.

Next, the first inorganic barrier layer 1510 is formed on the first light-emitting diode LED1. The first inorganic barrier layer 1510 may include at least one inorganic insulating material of aluminum oxide, titanium oxide, tantalum oxide, hafnium oxide, zinc oxide, silicon oxide, silicon nitride, and silicon oxynitride, and may be deposited by a method such as chemical vapor deposition. The first inorganic barrier layer 1510 may be continuously formed to overlap a top surface and a side surface of the conductive bank layer 300 and a top surface of the first counter electrode 1230.

Figure 6I:
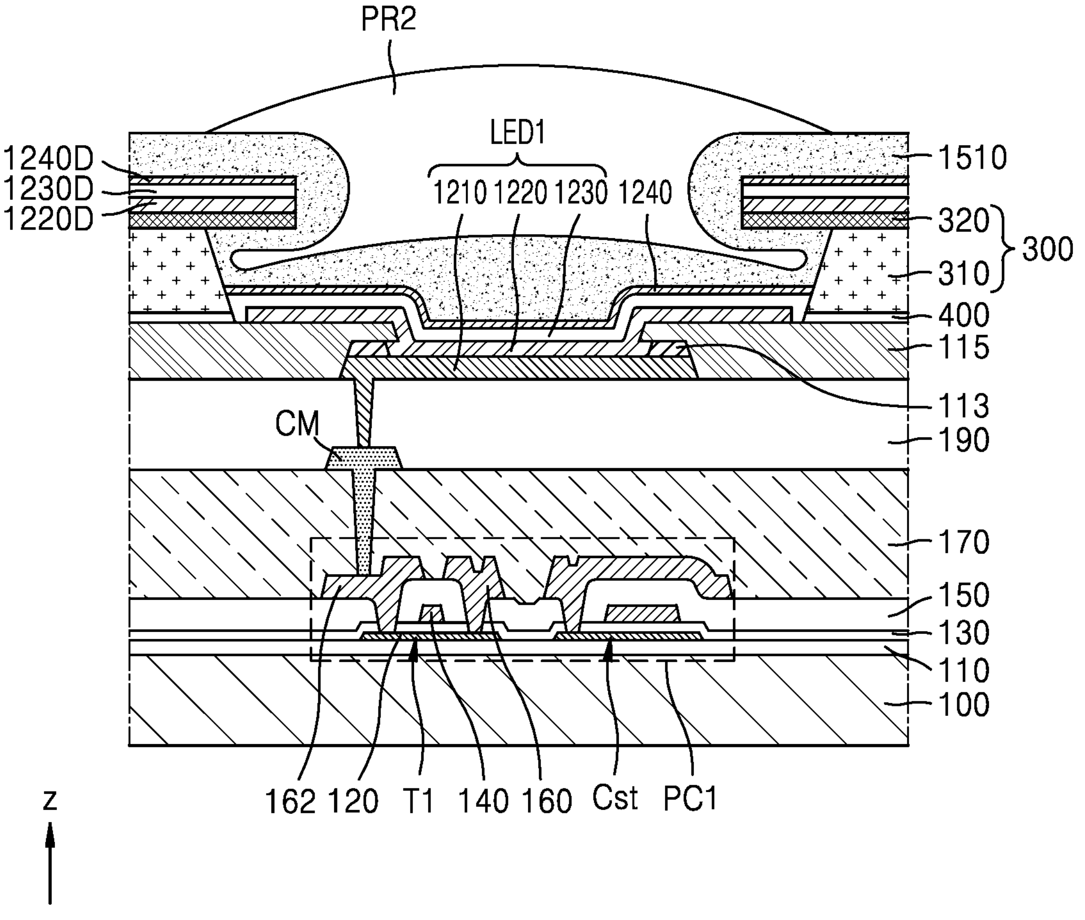

Referring to FIG. 6I, a second photoresist PR2 is formed on the first inorganic barrier layer 1510.

Figure 6J:
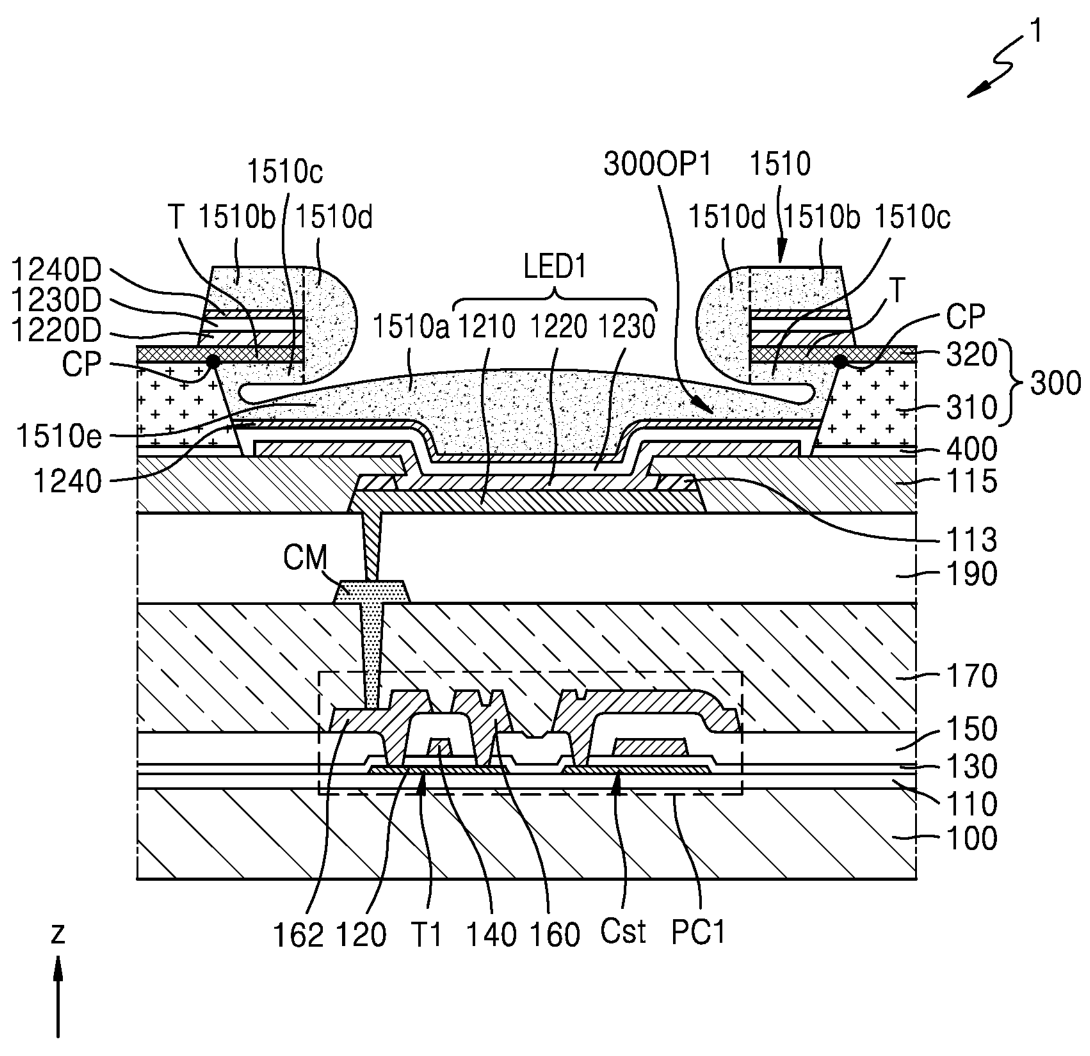

When a part of the first inorganic barrier layer 1510, a part of the first dummy capping layer 1240D, a part of the first dummy counter electrode 1230D, and a part of the first dummy intermediate layer 1220D which do not overlap the second photoresist PR2 are removed by the second photoresist PR2 as a mask, the first dummy capping layer 1240D, the first dummy counter electrode 1230D, and the first dummy intermediate layer 1220D are disposed around the first light-emitting diode LED1 as shown in FIG. 6J.

Although the first dummy capping layer 1240D, the first dummy counter electrode 1230D, and the first dummy intermediate layer 1220D are disposed on opposite sides of the first light-emitting diode LED1 in FIG. 6J that is a cross-sectional view, each of the first dummy capping layer 1240D, the first dummy counter electrode 1230D, and the first dummy intermediate layer 1220D may have a closed loop shape surrounding the first light-emitting diode LED1 when projected (or in a plan view) in a direction perpendicular to the substrate 100.

The first inorganic barrier layer 1510 may include the first to fifth portions 1510*a*, 1510*b*, 1510*c*, 1510*d*, and 1510*e* as described with reference to FIG. 3, and the first portion 1510*a* may not overlap the fourth portion 1510*d*. Accordingly, color deviation of light emitted from the first light-emitting diode LED1 may be prevented or minimized.

Figure 7:
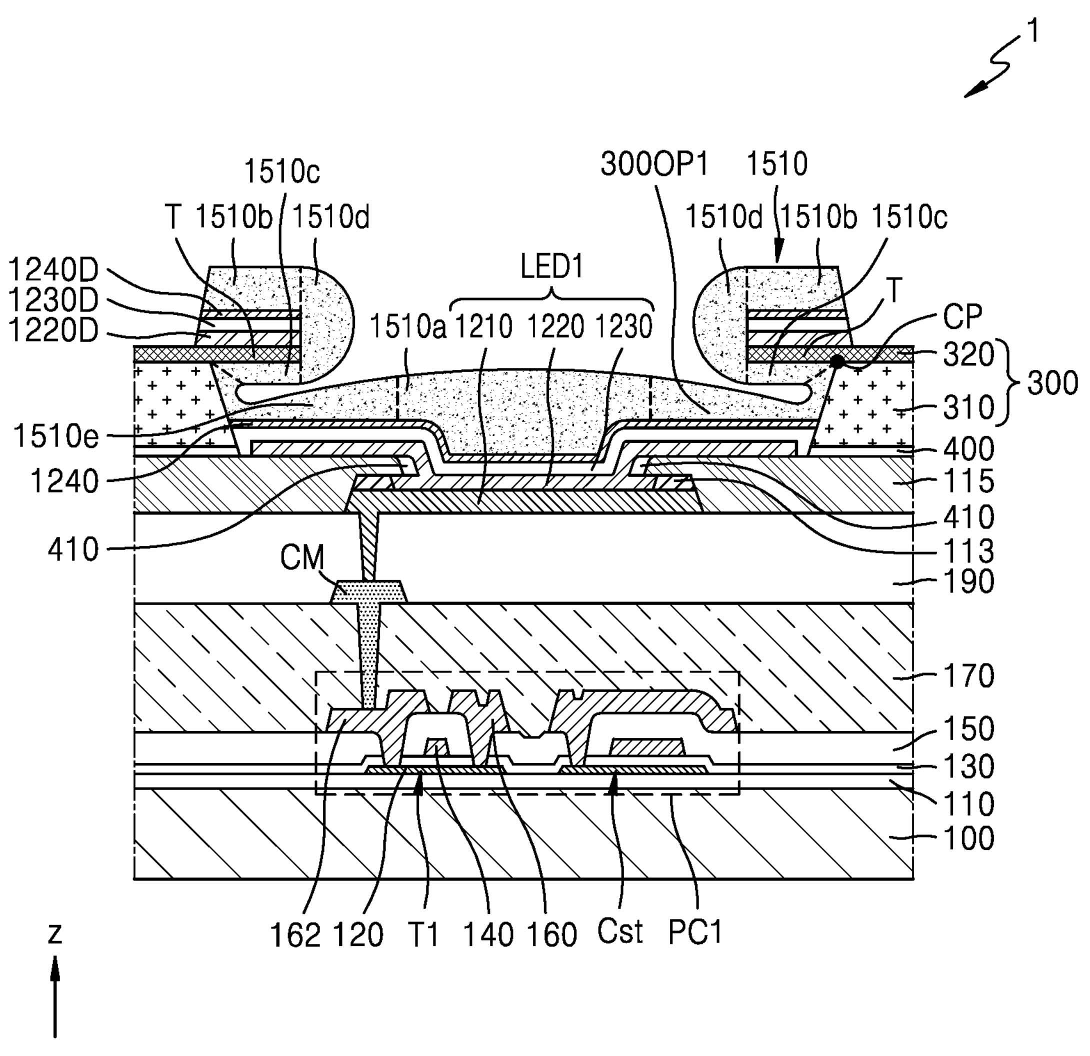
FIG. 7 is a cross-sectional view illustrating another embodiment of a part of a display apparatus.

FIG. 7 is a cross-sectional view illustrating another embodiment of a part of a display apparatus.

Because the display apparatus 1 of FIG. 7 has the same structure as that described with reference to FIG. 3 except that an insulating material portion 410 is further disposed around the opening 115OP of the insulating layer 115, a difference will be mainly described.

In a process of defining the opening 400OP by removing a part of the insulating protective layer 400 described with reference to FIG. 6G, a material corresponding to the insulating protective layer 400 may remain in the opening 115OP of the insulating layer 115 to form the insulating material portion 410.

Figure 8A:
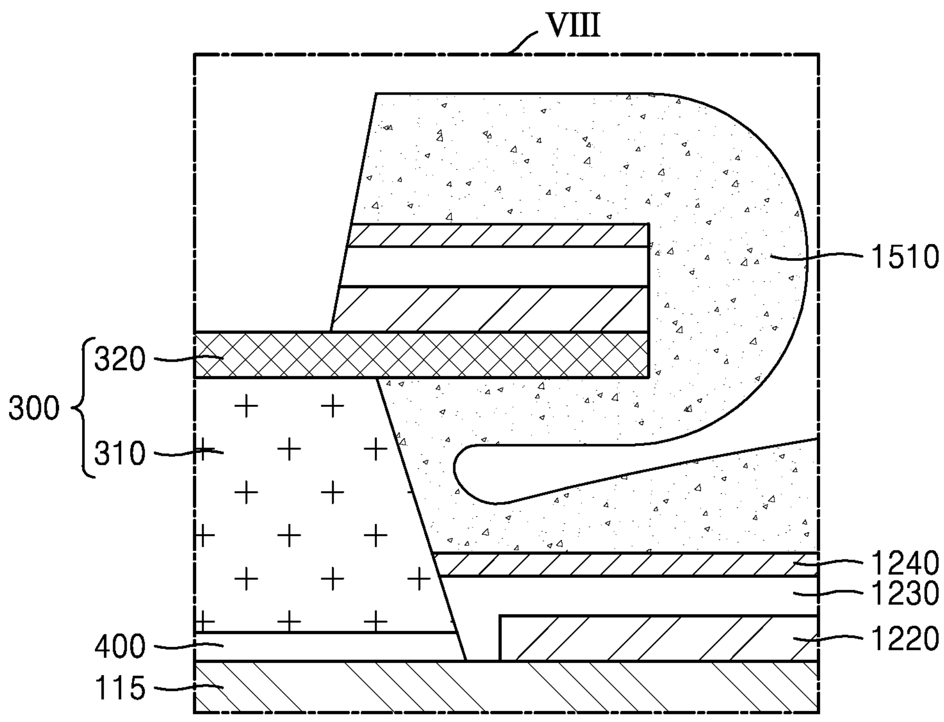
FIG. 8A is a cross-sectional view illustrating a portion VIII of the display apparatus of FIG. 3.
Figure 8B:
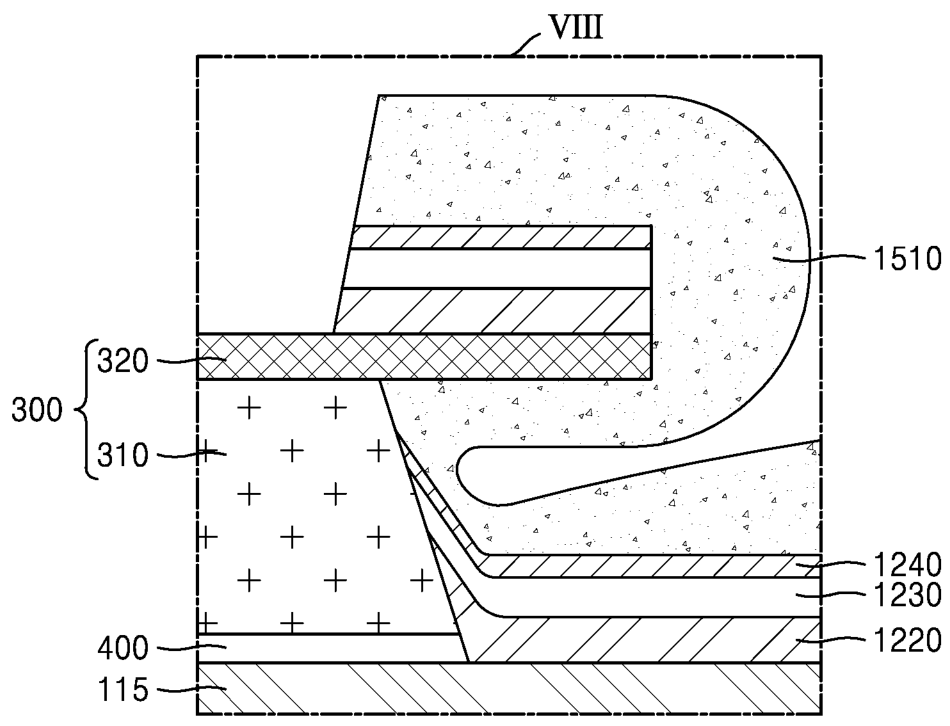
FIG. 8B is a cross-sectional view illustrating another embodiment of a portion of the display apparatus, which is a modification of the portion VIII of FIG. 8A.

FIG. 8A is a cross-sectional view illustrating a portion VIII of the display apparatus of FIG. 3. FIG. 8B is a cross-sectional view illustrating another embodiment of a portion of the display apparatus, which is a modification of the portion VIII of FIG. 8A.

Referring to FIG. 8A, an outer portion of the first intermediate layer 1220 may extend to the insulating layer 115 so that an edge of the first intermediate layer 1220 is spaced apart from the conductive bank layer 300 and the insulating protective layer 400. Because an outer portion of the first counter electrode 1230 and an outer portion of the first capping layer 1240 further extend past the edge of the first intermediate layer 1220, the outer portion of the first counter electrode 1230 and the outer portion of the first capping layer 1240 may directly contact a side surface of the conductive bank layer 300, e.g., an inclined side surface of the first conductive layer 310.

In another embodiment, referring to FIG. 8B, an edge of the first intermediate layer 1220 may be disposed on a side surface of the conductive bank layer 300. By controlling a deposition time and direction in a deposition process for forming the first intermediate layer 1220, an outer portion of the first intermediate layer 1220 may directly contact a side surface of the insulating protective layer 400 and the side surface of the conductive bank layer 300 (e.g., a side surface of the first conductive layer 310).

A thickness of a portion of the first intermediate layer 1220 disposed on the side surface of the conductive bank layer 300 (e.g., the side surface of the first conductive layer 310) may be less than a thickness of another portion of the first intermediate layer 1220 disposed on the first sub-pixel electrode 1210 (refer to FIG. 3) or the insulating layer 115. In an embodiment, a thickness of a portion of the first intermediate layer 1220 disposed on the side surface of the conductive bank layer 300 (e.g., the side surface of the first conductive layer 310) may be about ½ or less than about ½ of a thickness of another portion of the first intermediate layer 1220 disposed on the first sub-pixel electrode 1210 (refer to FIG. 3) or the insulating layer 115, for example.

An outer portion of the first counter electrode 1230 may overlap the side surface of the insulating protective layer 400 and the side surface of the conductive bank layer 300 (e.g., the side surface of the first conductive layer 310), and the first counter electrode 1230 may directly contact the side surface of the conductive bank layer 300 (e.g., the side surface of the first conductive layer 310) past an edge of the first intermediate layer 1220.

A thickness of a portion of the first counter electrode 1230 disposed on the side surface of the conductive bank layer 300 (e.g., the side surface of the first conductive layer 310) may be less than a thickness of another portion of the first counter electrode 1230 disposed on the first sub-pixel electrode 1210 (refer to FIG. 3) or the insulating layer 115. In an embodiment, a thickness of a portion of the first counter electrode 1230 disposed on the side surface of the conductive bank layer 300 (e.g., the side surface of the first conductive layer 310) may be about ½ or less than about ½ of a thickness of another portion of the first counter electrode 1230 disposed on the first sub-pixel electrode 1210 (refer to FIG. 3) or the insulating layer 115, for example.

Like the first counter electrode 1230, an outer portion of the first capping layer 1240 may overlap the side surface of the insulating protective layer 400 and the side surface of the conductive bank layer 300 (e.g., the side surface of the first conductive layer 310). A thickness of the outer portion of the first capping layer 1240 may be about ½ or less than about ½ of a thickness of an inner portion of the first capping layer 1240.

Figure 9:
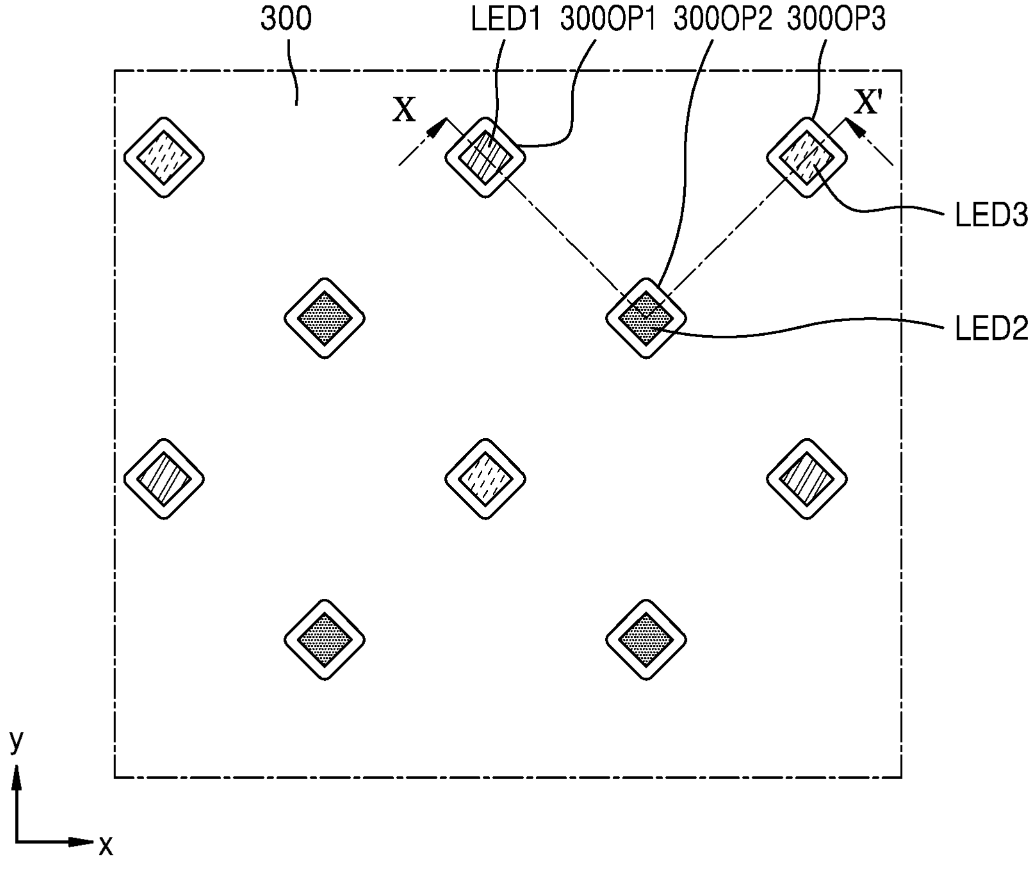
FIG. 9 is a plan view illustrating an embodiment of a display apparatus.
Figure 10:
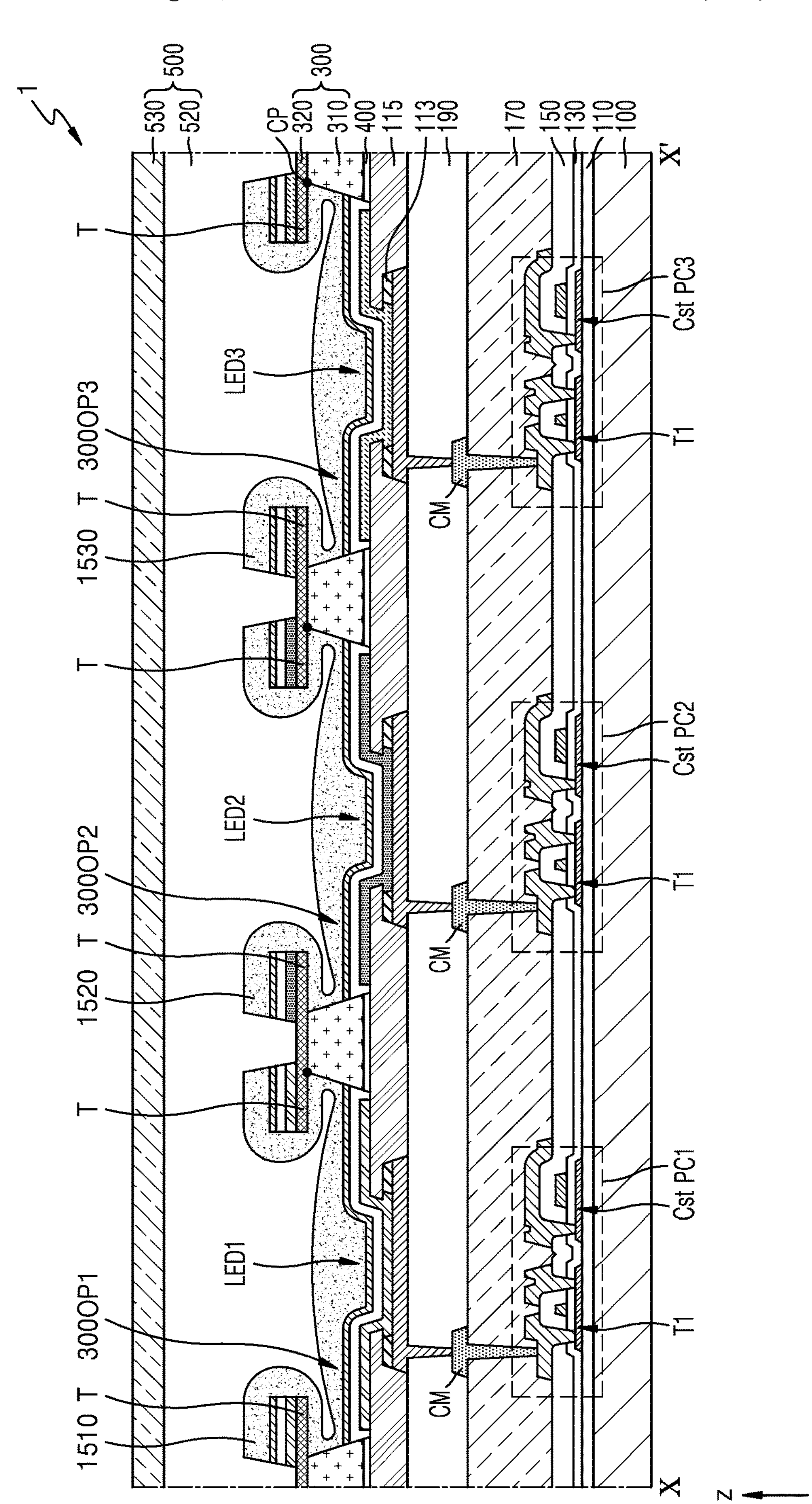
FIG. 10 is a cross-sectional view taken along line X-X' of FIG. 9.

FIG. 9 is a plan view illustrating an embodiment of a display apparatus. FIG. 10 is a cross-sectional view taken along line X-X' of FIG. 9.

As shown in FIG. 9, openings, e.g., first to third openings 300OP1, 300OP2, and 300OP3, respectively corresponding to first to third sub-pixels, may be defined in the conductive bank layer 300. The first to third openings 300OP1, 300OP2, and 300OP3 may be spaced apart from each other, and the conductive bank layer 300 may have a mesh structure in a plan view.

Referring to FIG. 9, first to third light-emitting diodes LED1, LED2, and LED3 may be respectively disposed in the first to third openings 300OP1, 300OP2, and 300OP3 of the conductive bank layer 300.

Referring to FIG. 10, the first to third light-emitting diodes LED1, LED2, and LED3 on the substrate 100 may be respectively electrically connected to first to third sub-pixel circuits PC1, PC2, and PC3.

The first to third sub-pixel circuits PC1, PC2, and PC3 may have substantially the same structure. In an embodiment, the second and third sub-pixel circuits PC2 and PC3 may have the same structure as that of the first sub-pixel circuit PC1, for example, and in this regard, FIG. 10 illustrates that each of the second and third sub-pixel circuits PC2 and PC3 includes the first transistor T1 and the storage capacitor Cst.

The first to third light-emitting diodes LED1, LED2, and LED3 may have substantially the same structure. As described with reference to FIGS. 3 to 8B, the first light-emitting diode LED1 of FIG. 10 may have a stacked structure of a first sub-pixel electrode, a first intermediate layer, and a first counter electrode disposed in a first opening 300OP1 of the conductive bank layer 300, and the insulating protective layer 400 in which an opening is defined may be disposed between the conductive bank layer 300 and the insulating layer 115.

The second light-emitting diode LED2 may have a stacked structure of a second sub-pixel electrode, a second intermediate layer, and a second counter electrode disposed in a second opening 300OP2 of the conductive bank layer 300, and the insulating protective layer 400 in which an opening is defined may be disposed between the conductive bank layer 300 and the insulating layer 115.

The third light-emitting diode LED3 may have a stacked structure of a third sub-pixel electrode, a third intermediate layer, and a third counter electrode disposed in a third opening of the conductive bank layer 300, and the insulating protective layer 400 in which an opening is defined may be disposed between the conductive bank layer 300 and the insulating layer 115.

The second light-emitting diode LED2 and the third light-emitting diode LED3 may have substantially the same structure and the same material except that an emission layer of the second intermediate layer and an emission layer of the third intermediate layer emit light of different colors and include materials emitting light of different colors. In other words, a cross-sectional structure corresponding to each of the second light-emitting diode LED2 and the third light-emitting diode LED3 may be substantially the same as or similar to the structure in embodiments described with reference to FIGS. 3 to 8B. Outer portions of the counter electrodes, e.g., the first to third counter electrodes, of the first to third light-emitting diodes LED1, LED2, and LED3 may directly contact a side surface of the first conductive layer 310 facing the first to third openings 300OP1, 300OP2, and 300OP3 as described with reference to FIG. 3. In other words, the counter electrodes of the first to third light-emitting diodes LED1, LED2, and LED3 which are physically separated or spaced apart from each other may be connected through contact with the conductive bank layer 300.

The first to third light-emitting diodes LED1, LED2, and LED3 may respectively overlap and/or be covered by first to third inorganic barrier layers 1510, 1520, and 1530. Inner portions of the first to third inorganic barrier layers 1510, 1520, and 1530 may respectively overlap the first to third light-emitting diodes LED1, LED2, and LED3, and outer portions may each overlap the tip T. Although the tips T of the conductive bank layer 300 are disposed on opposite sides of each of the first to third light-emitting diodes LED1, LED2, and LED3 in FIG. 10 that is a cross-sectional view, the tip T may have a shape surrounding the first to third light-emitting diodes LED1, LED2, and LED3 (when viewed in a direction perpendicular to a top surface of the substrate 100) in a plan view.

An encapsulation layer 500 may be disposed on the first to third inorganic barrier layers 1510, 1520, and 1530. In an embodiment, the encapsulation layer 500 may include an organic encapsulation layer 520 of a single body disposed on the first to third inorganic barrier layers 1510, 1520, and 1530 and corresponding to the first to third inorganic barrier layers 1510, 1520, and 1530, and may include an inorganic encapsulation layer 530 on the organic encapsulation layer 520, for example. In other words, the organic encapsulation layer 520 may be continuously formed to overlap a plurality of inorganic barrier layers, e.g., the first to third inorganic barrier layers 1510, 1520, and 1530. The inorganic encapsulation layer 530 may also be continuously formed to overlap a plurality of inorganic barrier layers, e.g., the first to third inorganic barrier layers 1510, 1520, and 1530.

In another embodiment, the encapsulation layer 500 may further include an inorganic encapsulation layer (lower inorganic encapsulation layer) disposed between the organic encapsulation layer 520 and the first to third inorganic barrier layers 1510, 1520, and 1530. The lower inorganic encapsulation layer may also be continuously formed to overlap a plurality of inorganic barrier layers, e.g., the first to third inorganic barrier layers 1510, 1520, and 1530.

The organic encapsulation layer 520 may include a polymer-based material. In embodiments, the polymer-based material may include an acrylic resin, an epoxy resin, polyimide, and polyethylene. In an embodiment, the organic encapsulation layer 520 may include acrylate.

The inorganic encapsulation layer 530 and/or the lower inorganic encapsulation layer may include at least one inorganic insulating material of aluminum oxide, titanium oxide, tantalum oxide, hafnium oxide, zinc oxide, silicon oxide, silicon nitride, and silicon oxynitride.

In an embodiment, damage to a sub-pixel electrode may be prevented or minimized, and color deviation of light emitted from a light-emitting diode may be prevented or minimized. These effects are examples, and do not limit the scope of the disclosure.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by one of ordinary skill in the art that various changes in form and details may be made therein without departing from the spirit and scope as defined by the following claims.

What is claimed is:

1. A display apparatus comprising:

a first sub-pixel electrode;

a conductive bank layer which is disposed on the first sub-pixel electrode and in which a first opening overlapping the first sub-pixel electrode is defined, the conductive bank layer comprising a first conductive layer and a second conductive layer having different etch selectivities from each other;

an insulating layer which is disposed between a peripheral portion of the first sub-pixel electrode and the conductive bank layer and in which an opening overlapping the first opening is defined;

an insulating protective layer which is disposed between the insulating layer and the conductive bank layer and in which an opening overlapping the first opening is defined, the insulating protective layer comprising an insulating material having an etch selectivity different from an etch selectivity of the insulating layer;

a first intermediate layer overlapping the first sub-pixel electrode through the first opening of the conductive bank layer;

a first counter electrode overlapping the first intermediate layer through the first opening of the conductive bank layer; and a first inorganic barrier layer on the first counter electrode.

2. The display apparatus of claim 1, wherein a width of the opening of the insulating protective layer is greater than a width of the opening of the insulating layer.

3. The display apparatus of claim 1, wherein the first inorganic barrier layer continuously overlaps a top surface and a side surface of the conductive bank layer and a top surface of the first counter electrode.

4. The display apparatus of claim 3, wherein the second conductive layer of the conductive bank layer is disposed on a top surface of the first conductive layer, wherein the second conductive layer comprises a tip protruding toward the first opening from a point at which the top surface of the first conductive layer and a bottom surface of the second conductive layer meet each other.

5. The display apparatus of claim 4, wherein the first inorganic barrier layer comprises:

a first portion overlapping the opening of the insulating layer;

a second portion overlapping a top surface of the tip of the second conductive layer;

a third portion overlapping a bottom surface of the tip of the second conductive layer; and a fourth portion between the second portion and the third portion, wherein, when projected in a direction perpendicular to a top surface of the first sub-pixel electrode, the first portion does not overlap the fourth portion.

6. The display apparatus of claim 5, wherein the fourth portion of the first inorganic barrier layer comprises a round surface in a cross-sectional view.

7. The display apparatus of claim 5, wherein the first inorganic barrier layer further comprises a fifth portion between the third portion and the first portion, wherein the fourth portion overlaps the fifth portion and a part of the fourth portion directly contacts a part of the fifth portion.

8. The display apparatus of claim 7, wherein a cavity is defined between the third portion and the fifth portion and under the tip.

9. The display apparatus of claim 1, wherein the insulating protective layer and the insulating layer comprise different inorganic insulating materials from each other.

10. The display apparatus of claim 1, further comprising an insulating material portion disposed on a side surface of the insulating layer in the opening of the insulating layer, the insulating material portion and the insulating protective layer comprising a same material.

11. The display apparatus of claim 1, further comprising a conductive protective layer which is disposed between the first sub-pixel electrode and the insulating layer and in which an opening overlapping the opening of the insulating layer is defined.

12. The display apparatus of claim 11, wherein the conductive protective layer comprises at least one conductive oxide of indium tin oxide, indium zinc oxide, indium gallium zinc oxide, indium tin zinc oxide, zinc oxide (ZnO), aluminum-doped zinc oxide, gallium-doped zinc oxide, zinc tin oxide, gallium tin oxide, and fluorine-doped tin oxide, wherein the insulating protective layer comprises an amorphous inorganic insulating material of at least one of silicon oxide and silicon nitride.

13. A method of manufacturing a display apparatus, the method comprising:

forming a first sub-pixel electrode;

forming an insulating layer in which an opening overlapping the first sub-pixel electrode is defined;

forming an insulating protective layer disposed on the insulating layer and overlapping the first sub-pixel electrode through the opening of the insulating layer;

forming a conductive bank layer which is disposed on the insulating protective layer and in which a first opening overlapping the first sub-pixel electrode is defined, the conductive bank layer comprising a first conductive layer and a second conductive layer having different etch selectivities from each other;

defining an opening of the insulating protective layer overlapping the first opening by etching a part of the insulating protective layer through the first opening of the conductive bank layer;

forming a first intermediate layer overlapping the first sub-pixel electrode through the first opening of the conductive bank layer and the opening of the insulating protective layer;

forming a first counter electrode overlapping the first intermediate layer; and forming a first inorganic barrier layer on the first counter electrode.

14. The method of claim 13, wherein a width of the opening of the insulating protective layer is greater than a width of the opening of the insulating layer.

15. The method of claim 13, further comprising forming a conductive protective layer which is disposed between the first sub-pixel electrode and the insulating layer and in which an opening overlapping the opening of the insulating layer is defined.

16. The method of claim 15, wherein the forming the conductive protective layer comprises defining the opening of the conductive protective layer by etching a part of the conductive protective layer, wherein an etching process for defining the opening of the conductive protective layer is different from an etching process for defining the opening of the insulating protective layer.

17. The method of claim 16, wherein the conductive protective layer comprises at least one conductive oxide of indium tin oxide, indium zinc oxide, indium gallium zinc oxide, indium tin zinc oxide, zinc oxide (ZnO), aluminum-doped zinc oxide, gallium-doped zinc oxide, zinc tin oxide, gallium tin oxide, and fluorine-doped tin oxide, wherein the insulating protective layer comprises an amorphous inorganic insulating material of at least one of silicon oxide and silicon nitride.

18. The method of claim 13, wherein the first inorganic barrier layer continuously overlaps a top surface and a side surface of the conductive bank layer and a top surface of the first counter electrode.

19. The method of claim 13, wherein the forming the conductive bank layer comprises defining the first opening passing through the second conductive layer and the first conductive layer of the conductive bank layer, wherein the second conductive layer comprises a tip protruding toward the first opening from a point at which a top surface of the first conductive layer and a bottom surface of the second conductive layer meet each other.

20. The method of claim 19, wherein the first inorganic barrier layer comprises:

a first portion overlapping the opening of the insulating layer;

a second portion overlapping a top surface of the tip of the second conductive layer;

a third portion overlapping a bottom surface of the tip of the second conductive layer; and a fourth portion between the second portion and the third portion, wherein, when projected in a direction perpendicular to a top surface of the first sub-pixel electrode, the first portion does not overlap the fourth portion.

21. The method of claim 20, wherein the fourth portion of the first inorganic barrier layer comprises a round surface in a cross-sectional view.

22. The method of claim 20, wherein the first inorganic barrier layer further comprises a fifth portion between the third portion and the first portion, wherein the fourth portion overlaps the fifth portion and a part of the fourth portion directly contacts a part of the fifth portion.

23. The method of claim 22, further comprising defining a cavity between the third portion and the fifth portion and under the tip.

24. The method of claim 13, wherein the insulating protective layer and the insulating layer comprise different inorganic insulating materials from each other.

25. The method of claim 13, further comprising forming an insulating material portion disposed on a side surface of the insulating layer in the opening of the insulating layer, wherein the insulating material portion and the insulating protective layer comprise a same material.

* * * * *